US008543873B2

(12) United States Patent
Sul

(10) Patent No.: US 8,543,873 B2
(45) Date of Patent: Sep. 24, 2013

(54) MULTI-SITE TESTING OF COMPUTER MEMORY DEVICES AND SERIAL IO PORTS

(75) Inventor: Chinsong Sul, Mountain View, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 736 days.

(21) Appl. No.: 12/683,365

(22) Filed: Jan. 6, 2010

(65) Prior Publication Data
US 2011/0167308 A1    Jul. 7, 2011

(51) Int. Cl.
G11C 29/10 (2006.01)
G11C 29/54 (2006.01)

(52) U.S. Cl.
USPC .......................................... 714/718; 714/716

(58) Field of Classification Search
None
See application file for complete search history.

(56) References Cited

U.S. PATENT DOCUMENTS

| | | | |
|---|---|---|---|
| 5,025,421 A | 6/1991 | Cho | |
| 5,138,619 A | 8/1992 | Fasang et al. | |
| 5,568,437 A | 10/1996 | Jamal | |
| 5,787,097 A * | 7/1998 | Roohparvar et al. | 714/722 |
| 5,923,675 A | 7/1999 | Brown et al. | |
| 6,085,346 A | 7/2000 | Lepejian et al. | |
| 6,297,997 B1 * | 10/2001 | Ohtani et al. | 365/201 |
| 6,424,583 B1 * | 7/2002 | Sung et al. | 365/201 |
| 6,928,593 B1 | 8/2005 | Halbert et al. | |
| 7,099,278 B2 * | 8/2006 | Momtaz | 370/249 |
| 7,161,964 B2 * | 1/2007 | Lentine et al. | 370/535 |
| 7,184,916 B2 * | 2/2007 | Resnick et al. | 702/118 |
| 7,200,059 B2 | 4/2007 | Fujioka et al. | |
| 7,460,418 B2 * | 12/2008 | Jung et al. | 365/194 |
| 7,653,849 B1 | 1/2010 | Tabatabaei | |
| 7,779,319 B1 | 8/2010 | Tabatabaei | |
| 2003/0023912 A1 | 1/2003 | Lesea | |
| 2004/0250187 A1 * | 12/2004 | Schauer et al. | 714/728 |
| 2005/0065747 A1 | 3/2005 | Premy et al. | |
| 2005/0077905 A1 | 4/2005 | Sasaki | |
| 2006/0176943 A1 | 8/2006 | Sindalovsky et al. | |
| 2007/0257693 A1 | 11/2007 | Stott et al. | |
| 2008/0010573 A1 * | 1/2008 | Sul | 714/731 |
| 2008/0016421 A1 | 1/2008 | McDevitt | |
| 2008/0059105 A1 | 3/2008 | Resnick et al. | |
| 2008/0100327 A1 | 5/2008 | Lee et al. | |
| 2008/0235547 A1 * | 9/2008 | Chan | 714/733 |
| 2009/0100295 A1 * | 4/2009 | Hiew et al. | 714/29 |
| 2009/0161458 A1 | 6/2009 | Pyeon | |

OTHER PUBLICATIONS

Jong et al., Memory interconnection test at board level, IEEE International Test Conference, 1992, Paper 17.1, pp. 328-337.*

(Continued)

Primary Examiner — Ajay Bhatia
Assistant Examiner — Dipakkumar Gandhi
(74) Attorney, Agent, or Firm — Blakely Sokoloff Taylor Zafman LLP

(57) ABSTRACT

A method and apparatus for multi-site testing of computer memory devices. An embodiment of a method of testing computer memory devices includes coupling multiple memory devices, each memory device having a serializer output and a deserializer input, wherein the serializer output of a first memory device is coupled with a deserializer input of one or more of the memory devices of the plurality of memory devices. The method further includes producing test signal patterns using a test generator of each memory device, serializing the test signal pattern at each memory device, and transmitting the serialized test pattern for testing of the memory devices, wherein testing of the memory devices includes a first test mode and a second test mode.

33 Claims, 22 Drawing Sheets

Serial IO interface
530

(56) References Cited

OTHER PUBLICATIONS

Clarke et al., Automatic Test Generation for the Analysis of a Real-Time System: Case Study, IEEE Real-Time Technology and Applications Symposium, 1997, pp. 112-124.*

Application Note 1328 Using Built-In Self-Tests (BIST) with SCAN50C400, National Semiconductor Corporation, Oct. 2004, pp. 1-12.*

International Searching Authority, International Search Report and Written Opinion for International Application No. PCT/US2010/039274 mailed Oct. 29, 2010, 23 pages.

Invitation to Pay Additional Fees for International Patent Application No. PCT/US2010/039274 mailed Aug. 20, 2010, 6 pages.

Non-Final Office Action for U.S. Appl. No. 12/497,391 mailed Dec. 22, 2010, 13 pages.

Silicon Image, Inc., et al., "Serial Port Memory Technology", Specification Version 1.0, Jun. 15, 2007, 41 pages.

Final Office Action for U.S. Appl. No. 12/497,391 mailed May 27, 2011.

Non-Final Office Action for U.S. Appl. No. 12/497,391, Mailed Sep. 19, 2011.

International Search Report and Written Opinion of the International Searching Authority dated Apr. 22, 2013, in International Patent Application No. PCT/US2011/020055, 10 pages.

\* cited by examiner

FIG. 3

| SPDRAM Command Format | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|
| | DATA | ACT | CMD | | Bank | | | | SubCmd | | | | | FLAGS | | | |
| MEMORY COMMAND GROUP | | | | | | | | | | | | | | | | | |
| ABNK | 0 | 0 | 1 | 1 | Bank | | | | RFU | BL | RFU | | | | | | |
| ACT | 0 | 1 | | | | | | | RA | | | | | | | | |
| WR | 0 | 0 | 1 | AP | Bank | | | | Col | | | | | | | | |
| RD | 0 | 0 | 0 | AP | Bank | | | | Col | | | | | | | | |
| PCG | 0 | 0 | 1 | 1 | Bank | | | | 1 | 1 | 1 | 1 | 1 | 0 | 0 | 0 | 0 |
| PCA | 0 | 0 | 1 | 1 | RFU | | | | 1 | 1 | 1 | 1 | 1 | 0 | 0 | 0 | 1 |
| REFB | 0 | 0 | 1 | 1 | Bank | | | | 1 | 1 | 1 | 1 | 1 | 0 | 0 | 1 | 0 |
| REFA | 0 | 0 | 1 | 1 | RFU | | | | 1 | 1 | 1 | 1 | 1 | 0 | 0 | 1 | 1 |
| MEMORY DATA | | | | | | | | | | | | | | | | | |
| DATA | 1 | Upper Byte | | | | | | | | | | | Lower Byte | | | | |
| LINK SYNCRHONIZATION GROUP | | | | | | | | | | | | | | | | | |
| SYNC | 0 | 0 | 0 | 0 | 1 | 1 | 1 | 1 | 1 | 0 | 1 | 0 | 1 | 1 | 0 | 0 | 0 |
| SYNC2 | 0 | 0 | 0 | 0 | 1 | 1 | 1 | 1 | 1 | 0 | 1 | 0 | 1 | 1 | 1 | 0 | 1 |

US 8,543,873 B2

MULTI-SITE TESTING OF COMPUTER MEMORY DEVICES AND SERIAL IO PORTS

TECHNICAL FIELD

Embodiments of the invention generally relate to the field of computer memory and serial input/output (IO) and, more particularly, to a method and apparatus for multi-site testing of computer memory devices and serial IO ports.

BACKGROUND

Computer memory devices have increasingly dense architecture, as advances in technology allow for smaller and smaller components within each device. Each memory device thus has become more complicated for testing, as the memory to be tested has become more complex.

Within serial port memory devices, there may be increasing numbers of memory subparts and serial IO ports that require testing. The testing of such devices efficiently poses a significant challenge to manufacturers, who are commonly forced to free up more silicon area for memory cells instead of testing circuitry and to expend significant effort and expense in board testing.

Within this environment, manufacturers fabricate growing numbers of memory boards or devices, with pressure to reduce costs. For this reason, manufacturers are faced with issues regarding how to test multiple devices efficiently, while also accurately determining which of the tested memory devices actually contains a flaw and what kind of flaw is present.

SUMMARY OF THE INVENTION

A method and apparatus are provided for multi-site testing of computer memory devices and serial IO ports.

In a first aspect of the invention, a method of testing computer memory devices includes coupling multiple memory devices, each memory device having a serializer output and a deserializer input, wherein the serializer output of a first memory device is coupled with a deserializer input of one or more of the memory devices. The method further includes producing test signal patterns using a test generator of each memory device, serializing the test signal pattern at each memory device, and transmitting the serialized test pattern for testing of the plurality of memory devices, wherein testing of the memory devices includes a first test mode and a second test mode.

In a second aspect of the invention, a memory device includes one or more memory banks for the storage of data, an output including a serializer to serialize data, and an input including a deserializer to deserialize data. The device further includes a test generator to generate one or more test patterns for the testing of the memory and an error detector to detect errors in received data. The device further includes a switch and port logic coupled with the memory bank and one or more switching elements to establish one or more test paths for the memory apparatus, the test paths including a first test path for a first test mode and a second test path for a second test mode.

In a third aspect of the invention, a memory testing apparatus includes an input to receive data from one or more memory devices, each memory device having a serializer output and a deserializer input, wherein the serializer output of a first memory device is coupled with a deserializer input of one or more other memory devices. The apparatus further includes an error checker to check the data from the one or more memory devices for errors, the error checker having a first test mode for testing a first aspect of the plurality of memory devices and a second mode for testing a second aspect of the plurality of memory devices.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 is an illustration of a command set for an embodiment of a device including an SPDRAM test structure;

DETAILED DESCRIPTION

Embodiments of the invention are generally directed to a method and apparatus for multi-site testing of computer memory devices and serial IO ports.

In some embodiments, computer memory devices may be tested through interconnection of multiple memory devices or boards. In some embodiments, the memory tested includes dynamic random access memory (DRAM). In some embodiments, a memory device is a serial port DRAM (SPDRAM)

device having memories that are accessed via high speed serial IO. In some embodiments, a SPDRAM test structure may test both high-speed serial IO links (a first test mode) and memory interface logic (a second test mode) via the same serial IO links.

Serial port memory is a new memory access technology that allows for accessing memory via high speed serial IO ports. The serial port memory technology leverages serializer-deserializer (SERDES) circuit innovation at the physical (PHY) layer. The high speed serial IO interface provides a high-bandwidth communication channel between a host and memories. Parallel data may be serialized before transmission and serialized data may de-serialized into parallel data at a receiver end. An advantage of serial links is that such link may be used to reduce pin count while simplifying layout issues for devices by eliminating trace match and congestion. Because each port is independent, there is no need to maintain phase relationships among the ports.

In some embodiments, multiple memory devices are tested at the same time, which may be referred to as multi-site testing. The testing at the same time may allow for reduction in test costs, and reducing cost of testing of memory and IC parts is a critical element in reducing overall part cost. Multi-site test techniques that can test multiple parts in parallel thus may be utilized to aid in achieving targeted test cost goals. A commonly cited problem with multi-site testing, especially when multiple devices are interconnected for test, however, is the difficulty in collecting error information of a device that are spreads over other devices and in determining which unit or units of the multiple units being tested are the defective units when an error is detected. In some embodiments, the collecting error information of a device (referred to as error localization) is obtained by communicating error information among devices under test that are interacting during the test. Optimization of the tester hardware, such as relays, is important for reduction in test cost and test complexity. In some embodiments, multi-site testing of serial IO includes clock skew tolerance between devices, such as between interacting serializers and deserializers, which may be utilized in providing efficient and effective testing.

Figure 1:
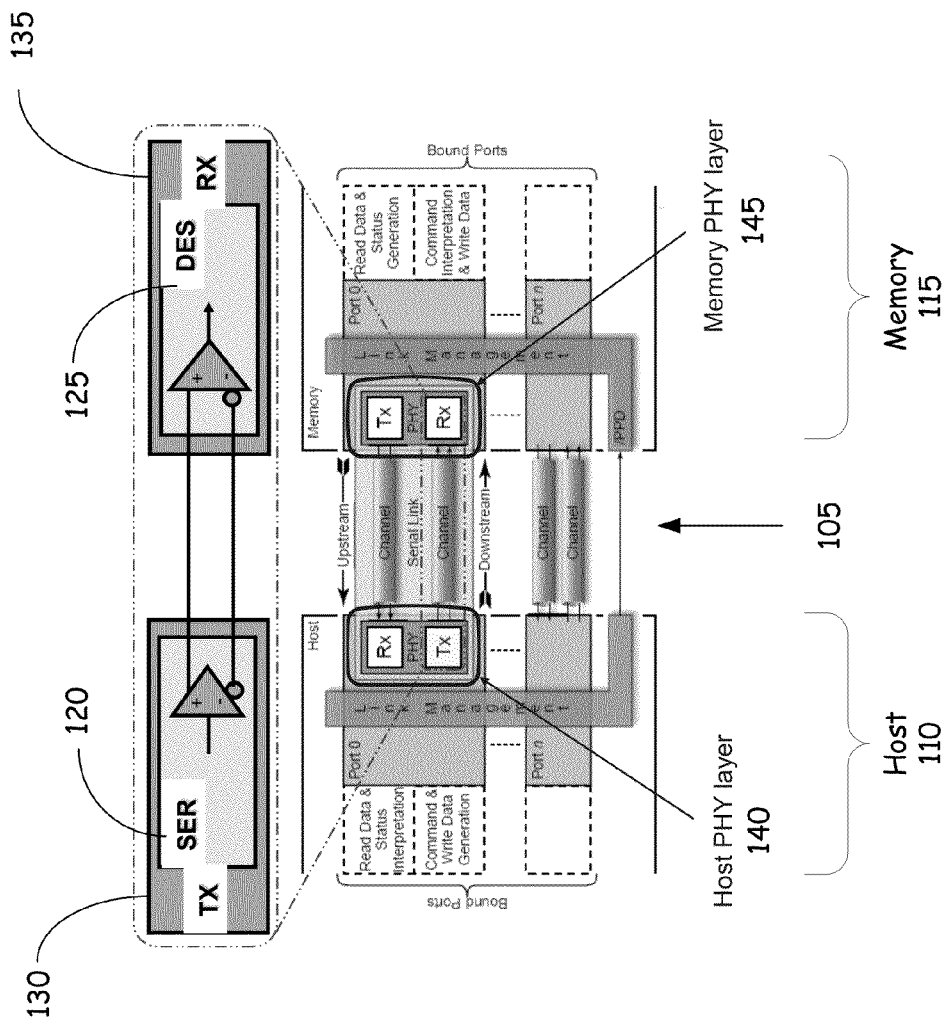
FIG. 1 is an illustration of an embodiment of an interface between a host and an SPDRAM memory device.

FIG. 1 is an illustration of an embodiment of an interface between a host and an SPDRAM memory device. In the illustrated system, a memory device 115 is a DRAM (dynamic random access memory), and is specifically a serial port DRAM (SPDRAM). A SPDRAM is a DRAM access technology that allows accessing memory via high speed serial IO ports. The SPDRAM may be coupled with a host 110, such as a system on a chip (SOC). An embodiment of an SPDRAM high speed serial interface 105 between the memory 115 and the host 115 is depicted at a system level in FIG. 1. In some embodiment, the SPDRAM high-speed serial interface leverages serializer-deserializer (SERDES) circuit innovation at the physical (PHY) layer. In this illustration, the host physical layer 140 includes a transmitter 130 containing a serializer 120, and the memory physical layer 145 includes a receiver 135 containing a deserializer 125. In some embodiments, the SPDRAM high speed serial interface 105 provides a high-bandwidth communication channel between the host PHY layer 140 and the memory PHY layer 145. In operation, parallel data is serialized before transmission and the serialized data is de-serialized into parallel data at the receiver end. Thus, a serializer-deserializer pair forms a communication channel between the memory 115 and the host/SOC 110.

Figure 2:
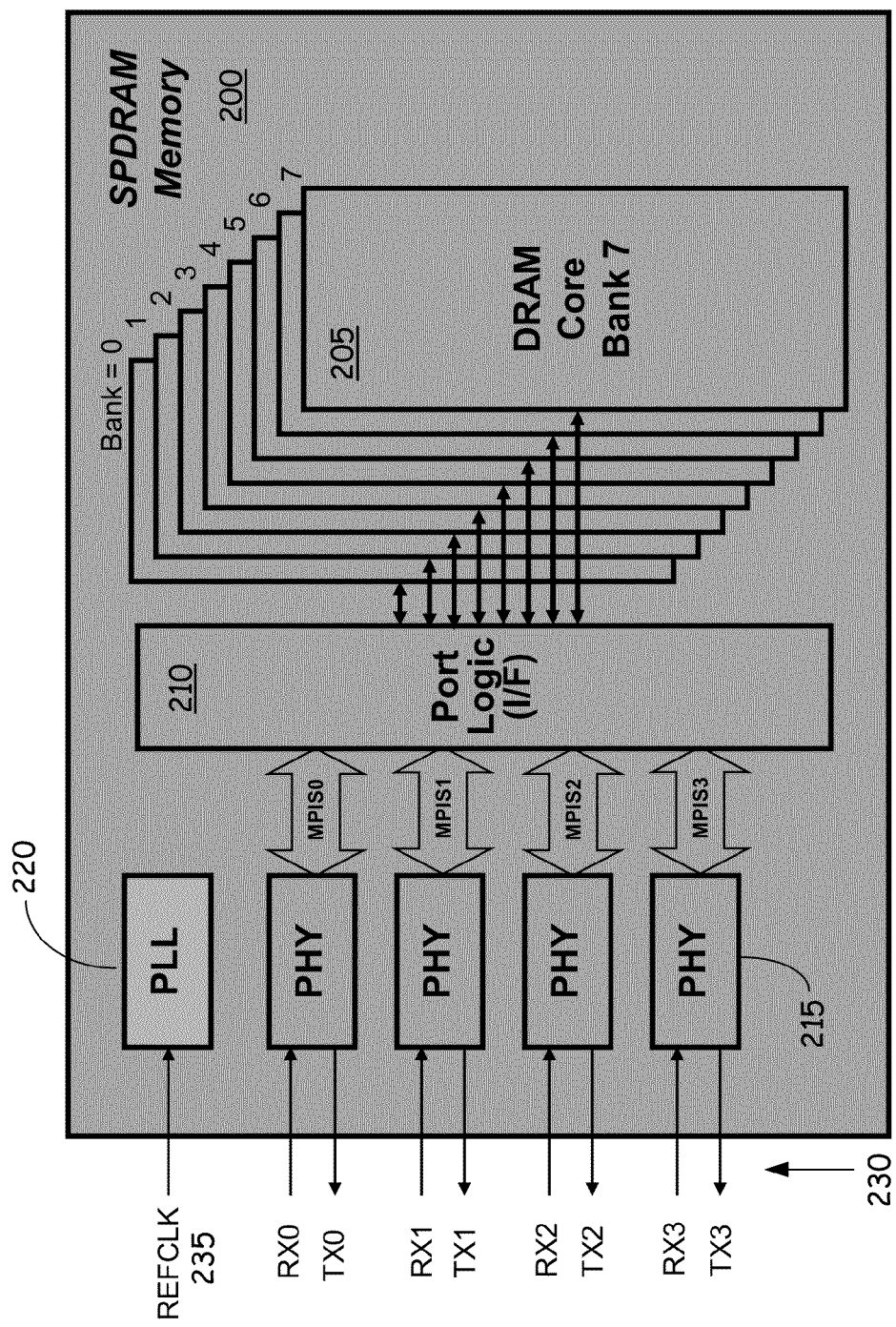
FIG. 2 is an illustration of an embodiment of an SPDRAM memory architecture.

FIG. 2 is an illustration of embodiment of an SPDRAM memory architecture. In this illustration, an SPDRAM memory 200 is a four channel serial memory with independent bank access for each of four ports 230. The ports 230 may comprise 4-wire differential transmit and receive links for sending commands or write data while simultaneously receiving read data at, for example, up to 5 Gbps (gigabits per seconds) each way. In some embodiments, a built-in test structure is provided for the memory, with the test structure being used in conjunction with the testing of the memory and the interface. As illustrated, the memory 200 further includes a physical layer 215 for each port connected via a port logic 210 to multiple DRAM core banks 205, shown here as banks 0 through 7. Also illustrated is a phase lock loop circuit 220 or other such circuit to produce a reference clock signal 235.

FIG. 3 is an illustration of a command set for an embodiment of a device including an SPDRAM test structure. The commands 300 include memory commands often utilized for testing DRAM memory, including precharge, activate bank (ABNK), activate (ACT), and write and read commands. In this illustration, the length of each command is 17 bits or 20 bits if encoded for transmission, with the commands including sync commands and memory commands. However, embodiments are not limited to any particular command set or command structure.

Figure 4:
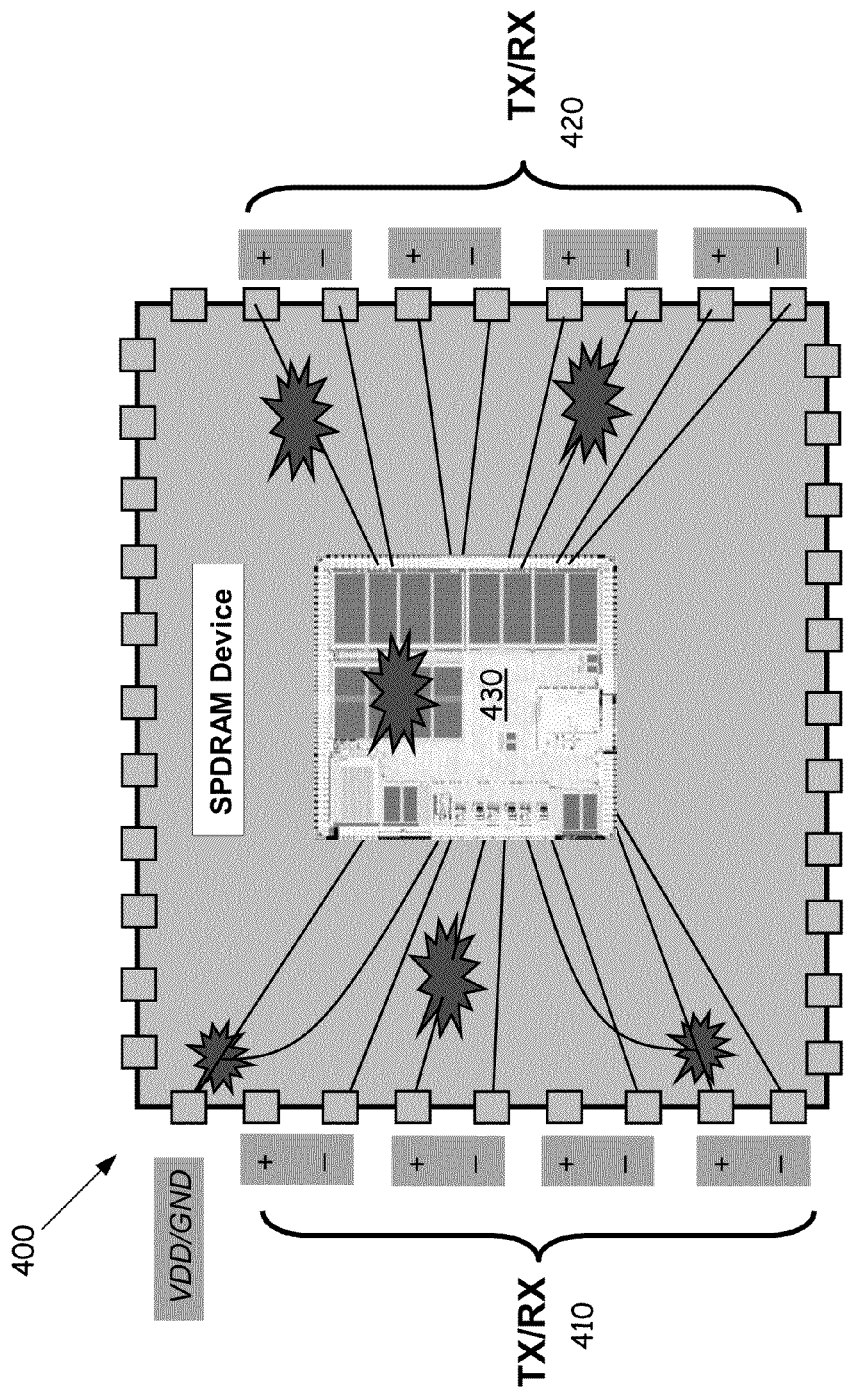
FIG. 4 is an illustration of manufacturing process defects detected by an embodiment of a detection system.

FIG. 4 is an illustration of manufacturing process defects detected by an embodiment of a detection system. The manufacturing defects for an SPDRAM device 400, shown here as including a first transmitter or receiver 410 and a second transmitter or receiver 420 coupled to a memory 430, may reside on bonding wires or on a die. Certain differential bonding wire defects may be difficult to detect because data communication may successfully be achieved in presence of defects. Open defects on one of differential wires, for example, may be tolerated and communication may be carried out through the remaining wire. In some embodiments, defects on the die, especially on memories, may be tested using the same built-in self-test (BIST) hardware that is present to test the SPDRAM memory interface and the serial IO interface.

Figure 5:
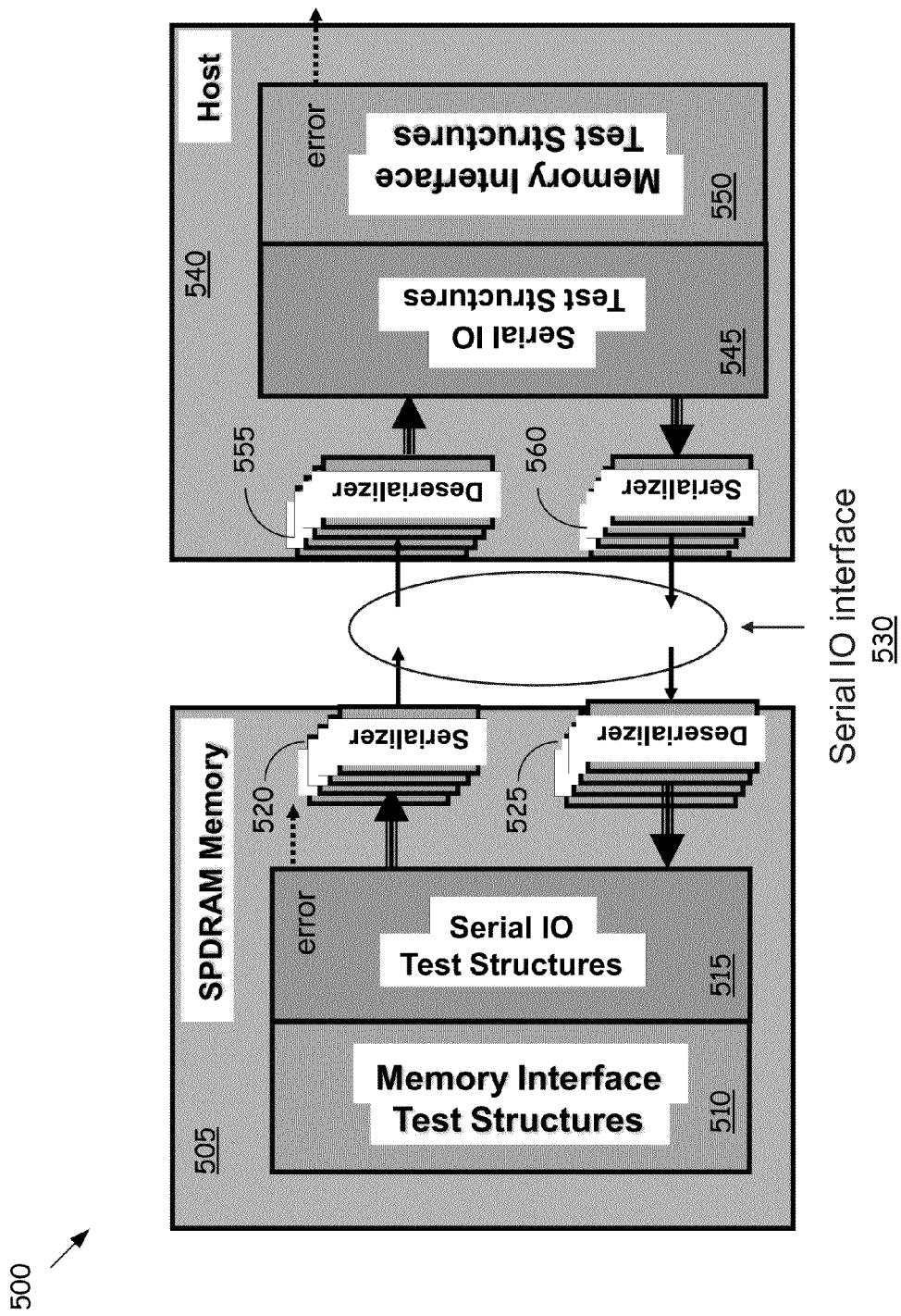
FIG. 5 is an illustration of embodiments of an SPDRAM memory and a host device containing built-in test structures.

In some embodiments, a SPDRAM test structure may test both high-speed serial IO links (a first test mode) and memory interface logic (a second test mode) via the same serial IO links FIG. 5 is an illustration of embodiments of an SPDRAM memory and a host device containing built-in test structures. FIG. 5 illustrates of an embodiment of a SPDRAM test structure for a memory PHY layer chip and a host PHY layer that may, for example, be embedded in system-on-chip (SOC). In some embodiments, the same test structures used to test the serial IO links and the memory interface logic.

In some embodiments, as described above, testing of serial IO is separated from testing of the memory interface logic. The testing of the memory interface may require the test patterns to comply with the SPDRAM protocol for the memory device under test. However, testing of the serial IO interface may be independent of the SPDRAM protocol. Separation of testing may be advantageous in that a full serial IO interface test may require more test patterns than what is allowed by the SPDRAM protocol. Separation of serial IO testing may be used to remove the test pattern compliance constraint and allow more diversified test patterns to be applied during a serial IO test. A rich set of diversified test patterns is an important element in achieving high test coverage. For the purposes of this application, because the serial IO test patterns may be 17-bit or 20-bit based, the 20-bit is used herein to illustrate the underlying concept.

In FIG. 5, built-in self-test (BIST) hardware to target the serial IO and the memory interface includes serial IO test structures and memory interface test structures, respectively. The serial IO test structures and the memory interface test structures may collectively be referred to as the SPDRAM test structure. As illustrated, a testing system includes a SPDRAM memory 505 and a host or other device 540, linked by a serial IO interface 530. The SPDRAM memory includes a memory interface test structure 510, a serial IO test structure 515, as well as serializers 520 and deserializers 525 to link to the PHY core via the serial IO interface 530. The host includes a memory interface test structure 550 and a serial IO test structure 545, as well as serializers 560 and deserializers 555 to link to the memory 505 via the serial IO interface 530.

Figure 6:
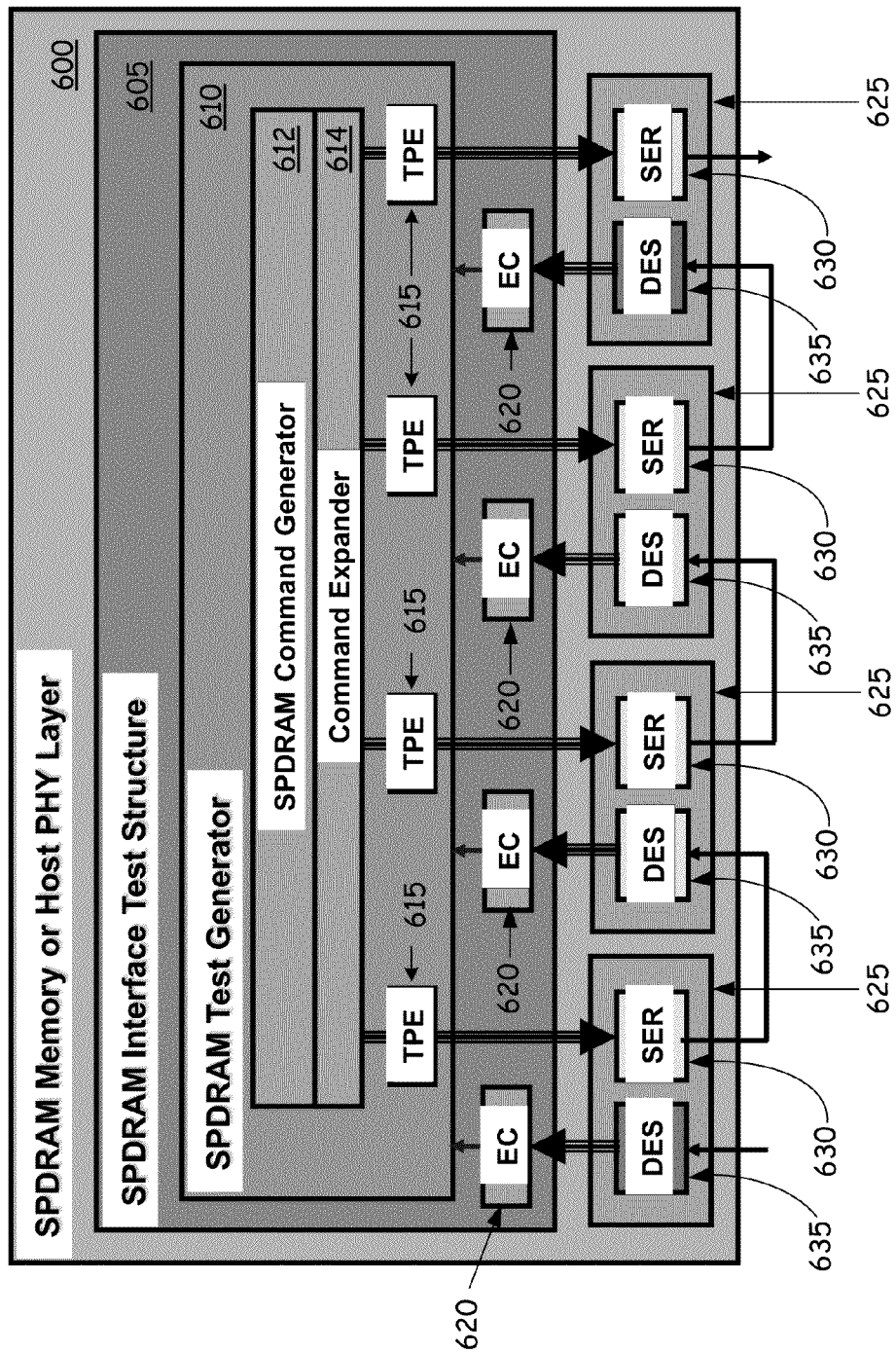
FIG. 6 is an illustration of an embodiment of a SPDRAM interface test architecture.

FIG. 6 is an illustration of an embodiment of an SPDRAM interface test architecture. In this illustration, a SPDRAM memory or a host 600 includes an SPDRAM interface test structure 605. In this illustration, the test structure 605 includes a SPDRAM test generator 610 and four error checkers 620, with each error checker 620 being denoted as EC in FIG. 6. Each error checker 620 is coupled with one of the ports 625, with each port including a serializer 630 and a deserializer 635 for communication via an interface. In an exemplary implementation, the test generator 610 includes an SPDRAM command generator 612 operable to generate a 20-bit test pattern, and a command expander 614 to expand the 20-bit test pattern into an 80-bit test pattern, and distribute each 20-bit pattern via test property embedding (TPE) units 615 to all four ports directly or via a memory interface. The error checker 620 in each port is capable of independently checking for errors in incoming streams of test pattern or test data observed at the deserializer. The error information is provided to the test generator so that it can be communicated.

Figure 7:
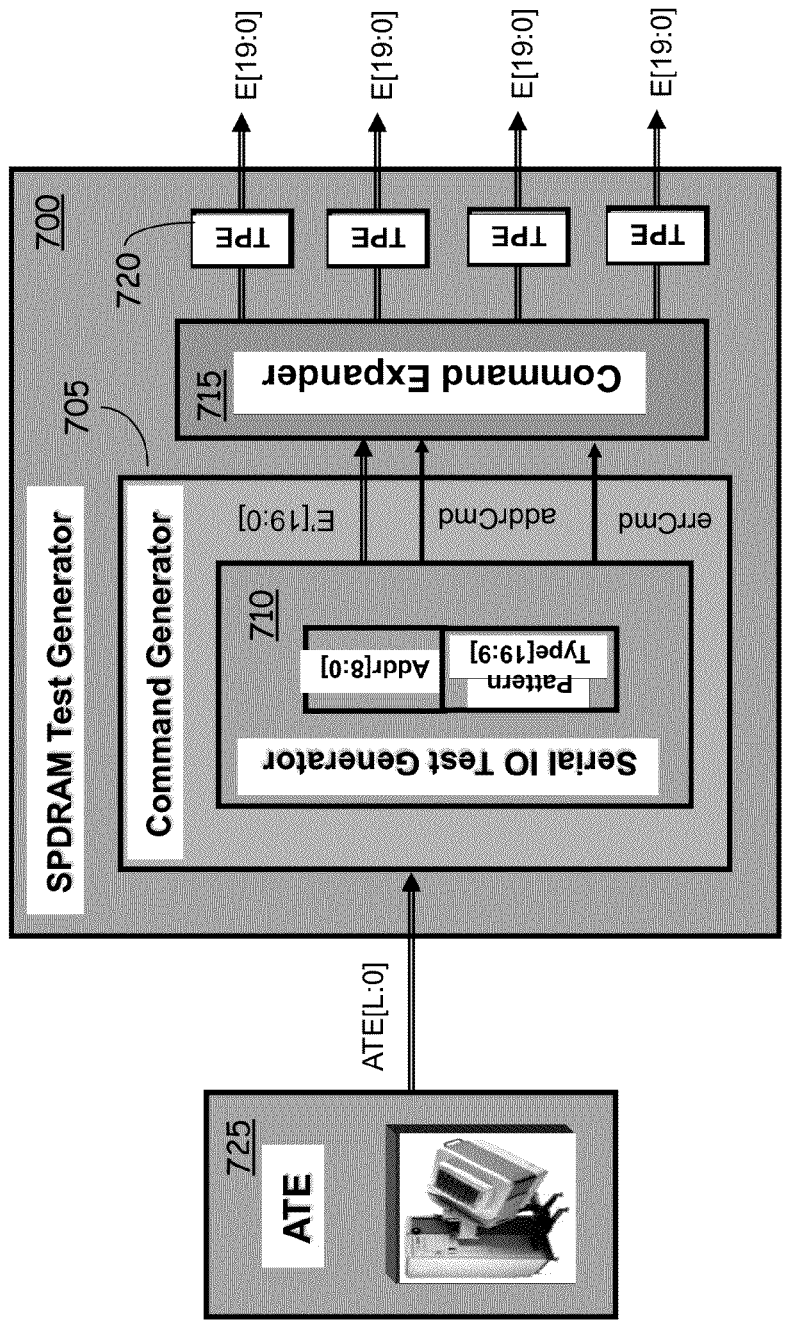
FIG. 7 is an illustration of an embodiment of an SPDRAM test generator.

FIG. 7 is an illustration of an embodiment of an SPDRAM test generator. In this illustration, the test generator 700 consists of SPDRAM command generator 705, command expander 715, and four test property embedding (TPE) units 720. The command generator 705, containing a serial IO test generator 710, may produce tests for the memory, memory interface, and serial IO interface. The command expander 715 is configured to accept one command and produces four commands of which each command is delivered to each serial IO. Based on the state of addrCmd and errCmd commands, the command expander 715 may produce proper commands to access memories and to communicate error information for all 4 serial ports. Each TPE unit may independently be enabled to modulate the test patterns at each channel in order to provide diversified test patterns to all PHY channels at a manageable hardware overhead. The hardware overhead of each TPE unit may be significantly smaller than that of an SPDRAM test generator that is shared by all PHY channels on the chip.

Figure 8:
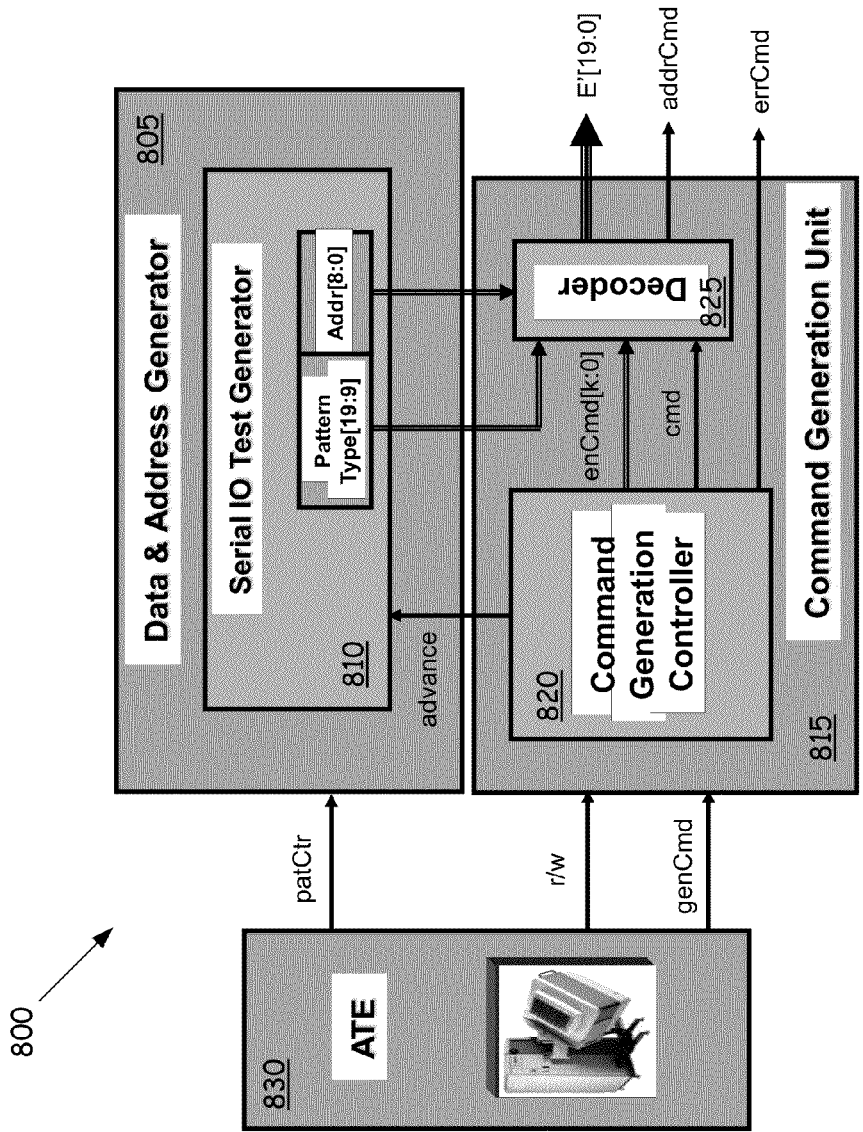
FIG. 8 is an illustration of an embodiment of an SPDRAM command generator that utilizes a serial IO test generator.

FIG. 8 is an illustration of an embodiment of an SPDRAM command generator that utilizes a serial IO test generator. In this illustration, an embodiment of an SPDRAM command generator includes a command generation controller 820, a decoder 825, and a data-and-address generator 805. In some embodiments, the command generation controller 820 of a command generation unit 815 sequences a desired test with an aid of the data-and-address generator 805 that contains the serial IO test generator 810. The serial IO test generator 810 may be used to test a serial IO interface. The generated serial IO test pattern need not be a SPDRAM command but be a raw data pattern. The command generation unit 815 may generate the addCmd for memory access commands such as READ or WRITE in order to aid the command expansion. The command generation unit 815 also may generate a custom command or a special pattern along with an errCmd in order to communicate the error information provided by the error checkers. In this illustration, the command generation unit 815 and data and address generator 805 receive signals from an automatic test generator 830.

If no external test pattern source is provided, the test patterns for memory and memory interface may be generated internally using the serial IO generator 810. FIG. 8 is an illustration of such SPDRAM memory test generator. Because the memory test data is highly repetitive and complementary in nature, their type may be provided from the serial IO test generator. For example, one test data may be writing all memory locations with ones, followed by reading one in all locations, again followed by writing zero in all locations, and so on. The test data pattern field G[19:9] may be used to provide the required test data patterns. The decoder 825 may produce the desired test data pattern based on the content of G[19:9]. The complementary test data may be provided from the same serial IO test generator 810 or obtained from complementing the corresponding test data using the pattern control input patCtr. A read/write control signal may also be provided from the ATE 830. In some embodiments, the test data pattern field G[19:9] may be increased, if needed, because the burst test data generation requires less number of address bits than the 9 bits available in G[8:0].

Figure 9:
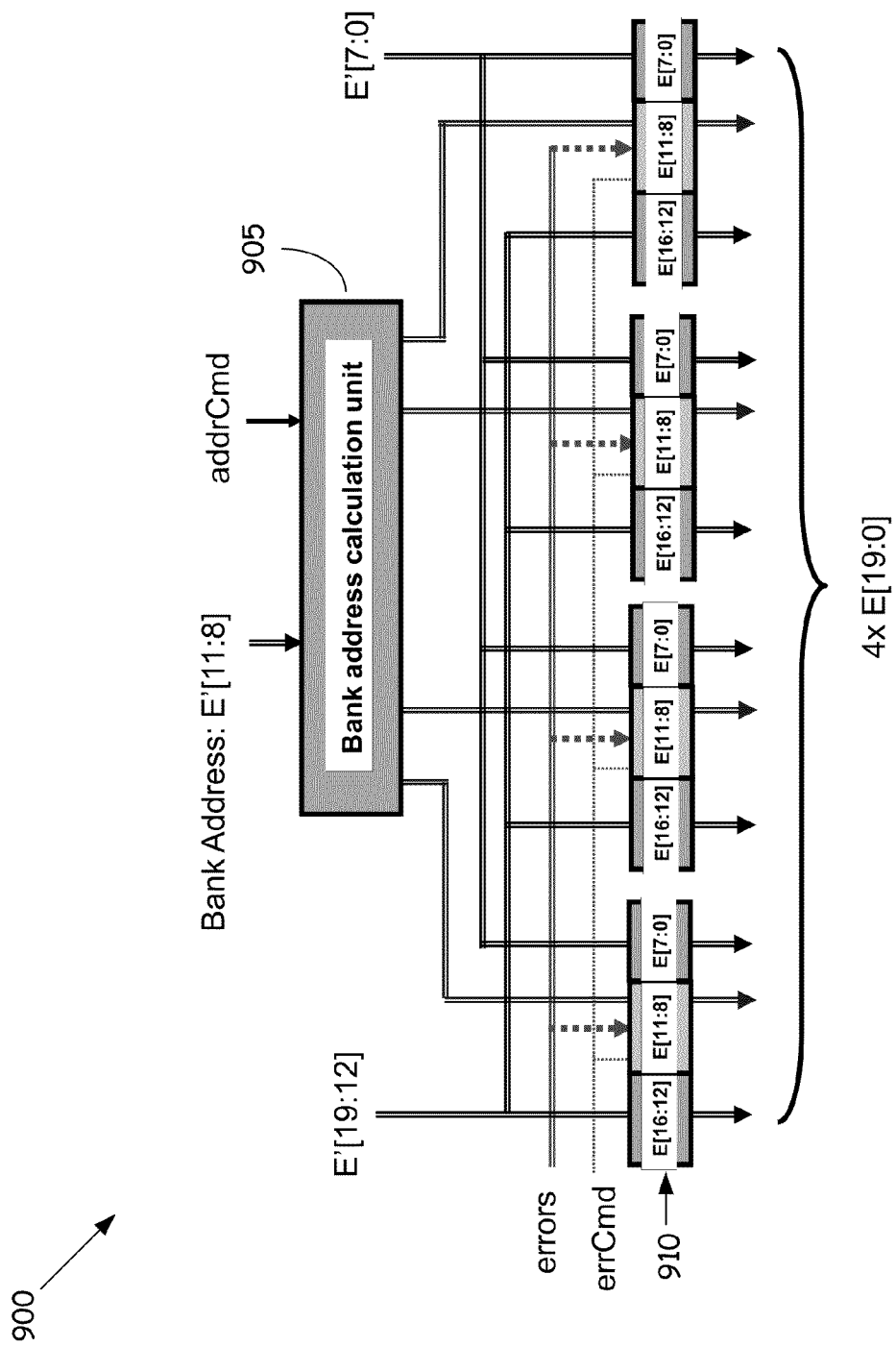
FIG. 9 is an illustration of an embodiment of a test data command expander.

In some embodiments, a test data expander may decode a single test data item into multiple test data items. In an example, a test data expander may expand a 20-bit test data into multiple 20-bit tests. For purposes of illustration, this specification generally describes a system or process using a 4× test data expander. However, embodiments are not limited to any particular expansion. In some embodiments, a system may be scalable such that characteristics of a 4× expansion would be also valid for an 8× expansion. FIG. 9 is an illustration of an embodiment of a test data expander. FIG. 9 specifically illustrates an embodiment of a 4× test data expander structure. In some embodiments, each 20-bit of expanded test data may be distributed to each serial IO port or port logic inside an SPDRAM memory chip. FIG. 9 illustrates an embodiment of a test data expander 900 including a bank address calculation unit 905. In this illustration, an SPDRAM command carries an address that may be indicated by addrCmd=1. In some embodiments, the command may be duplicated 4 times, with the exception of the bank address 910. The bank address, which in this illustration occupies bit locations from 11 to 8, i.e. E'[11:8], is transformed into four different mutually exclusive bank addresses to perform memory test in parallel. Similarly, if the errCmd=1, the bank address field may be used to carry error information of the corresponding error checker. Since the test result is communicated at the end of test, the errCmd may be asserted to logical 1 after the test is completed.

Figure 10:
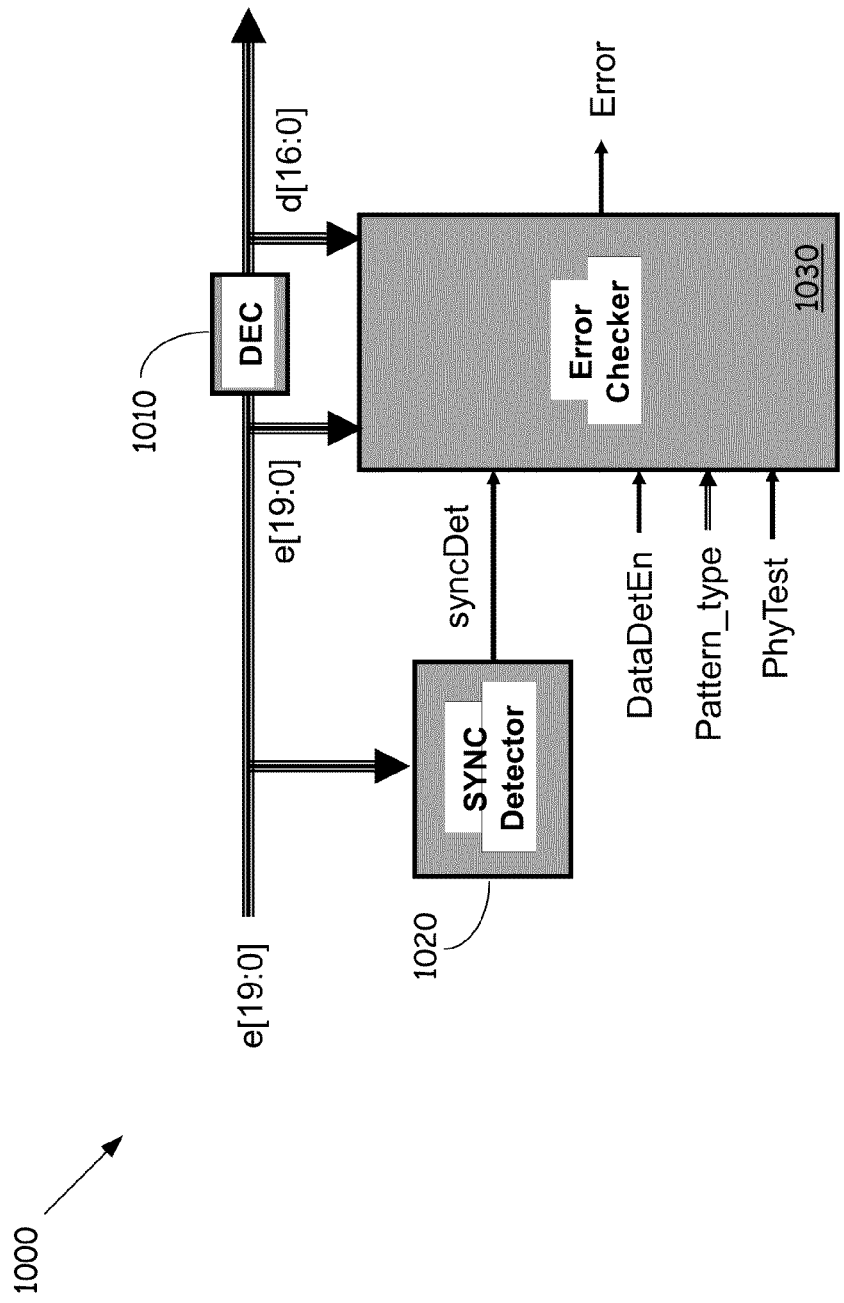
FIG. 10 illustrates an embodiment of an error checking system.

In some embodiments, an error checker may handle both serial IO test patterns and SPDRAM command based test patterns. FIG. 10 illustrates an embodiment of an error checking system. FIG. 10 specifically illustrates an SPDRAM error checker. In this illustration, an error checking system 1000 includes a decoder (DEC) 1010, SYNC detector 1020, and an error checker 1030, where the decoder 1010 translates 20-bit data into 17-bit data. In some embodiments, for a test that requires SPDRAM commands, the error checker 1030 may recognize the DATA command and all sync commands. In some embodiments, the error checking for memory may be carried out in a 17-bit data domain. During the test, for example, the d[16:0] may be occupied with the DATA command or the SYNC command. If the d[16:0] carries any other than the intended commands or any invalid read data in d[15:0], the error checker 1030 operates to flag an error.

The DATA command consists of 2 bytes (d[15:0]) of data with 1-bit command field (d[16]) in the 17-bit data domain. The d[16] is equal to e[19] in 19-bit encoded data domain, i.e. d[16]=e[19]. The detection of a DATA command is flagged by e[19]=1 or d[16]=1 and may be used to wake up the error checker 1030 for validation of the read data from memories. If the error detector 1030 detects the SYNC command, it may operate to maintain the previous state.

Memory test patterns may be repetitive, as described above. The memory test patterns may, for example, write zeros (or ones) in all memory locations followed by read zeros (ones). In an alternative, the test data and its complement may be written in all even and odd memory locations, respectively. In some embodiments, a system may extract test properties from existing repetitive test patterns. In some embodiments, the system may also embed the test property into the pseudo-random memory test patterns. The test properties may be checked to validate the memories under test in the SPDRAM error checker without incorporating dedicated memory pattern comparators. Extraction of test properties from test patterns may include processes provided in U.S. patent application Ser. No. 12/497,371, entitled "Computer Memory Test Structure", filed Jul. 2, 2009.

Figure 11:
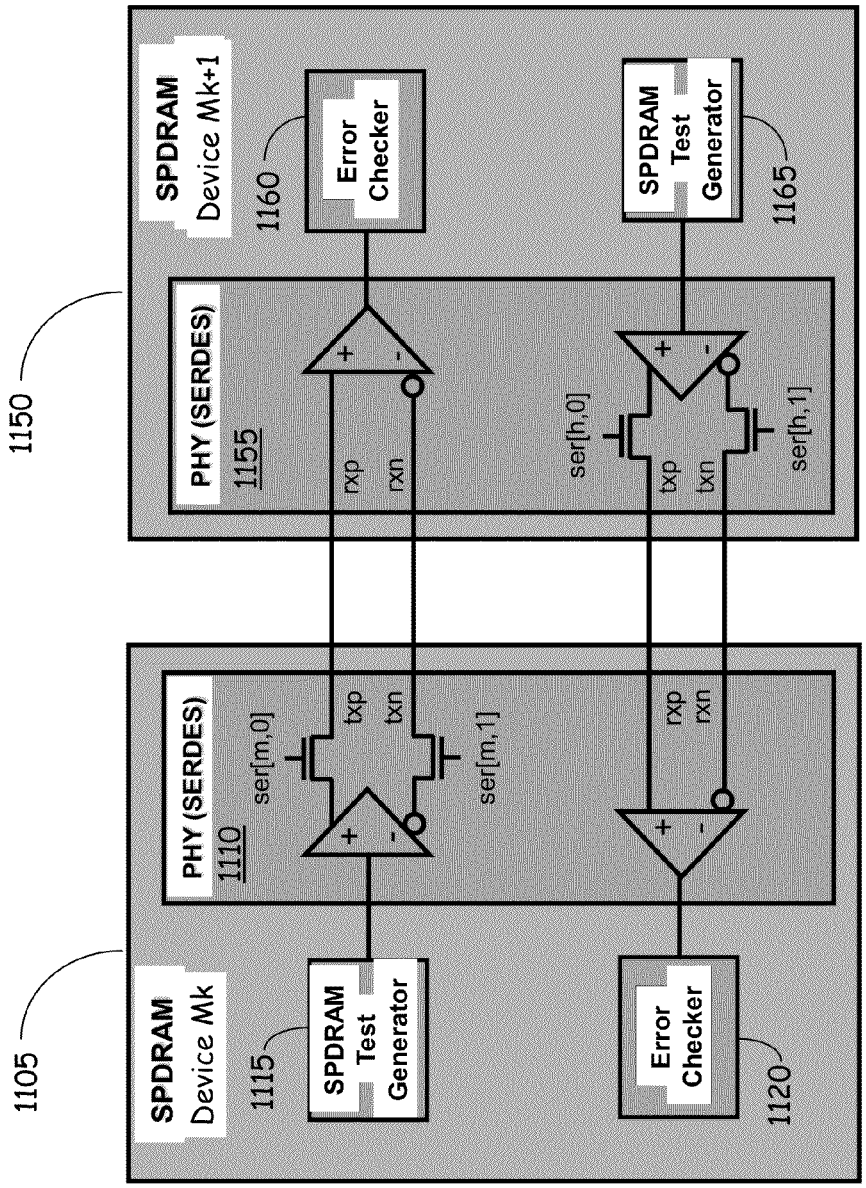
FIG. 11 is an illustration of an embodiment of a test structure for testing faults on differential serial IO bonding wires.

FIG. 11 is an illustration of an embodiment of a test structure for testing faults on differential serial IO bonding wires. In FIG. 11, an SPDRAM device Mk 1105, including an SPDRAM test generator 1115, error checker 1120, and serializer-deserializer (SERDES) 1110, is coupled with an SPDRAM device Mk+1 1150, including an SPDRAM test generator 1165, error checker 1160, and SERDES 1155. In this illustration, by turning on or off a connection control function (denoted as a transistor in SERDES 1110 or 1155), a test path may be established. For example, if ser[m,0]=1, the corresponding output of serializer may be denoted as positive and the output of device Mk 1105 is connected to the deserializer of device Mk+1 1150. However, the value ser[m,0]=0 will result in the output of the serializer being disconnected. The control function is denoted as a transistor for illustration purposes only, and the implementation of the control function may take various forms in varying embodiments. The control function, for example, may be realized by incorporating a control circuit or a program into a system function in order to control a signal source such that the target signal is blocked or suppressed. The same connection control function may be employed in the deserializer to enhance controllability and diagnostic resolution.

Figure 12:
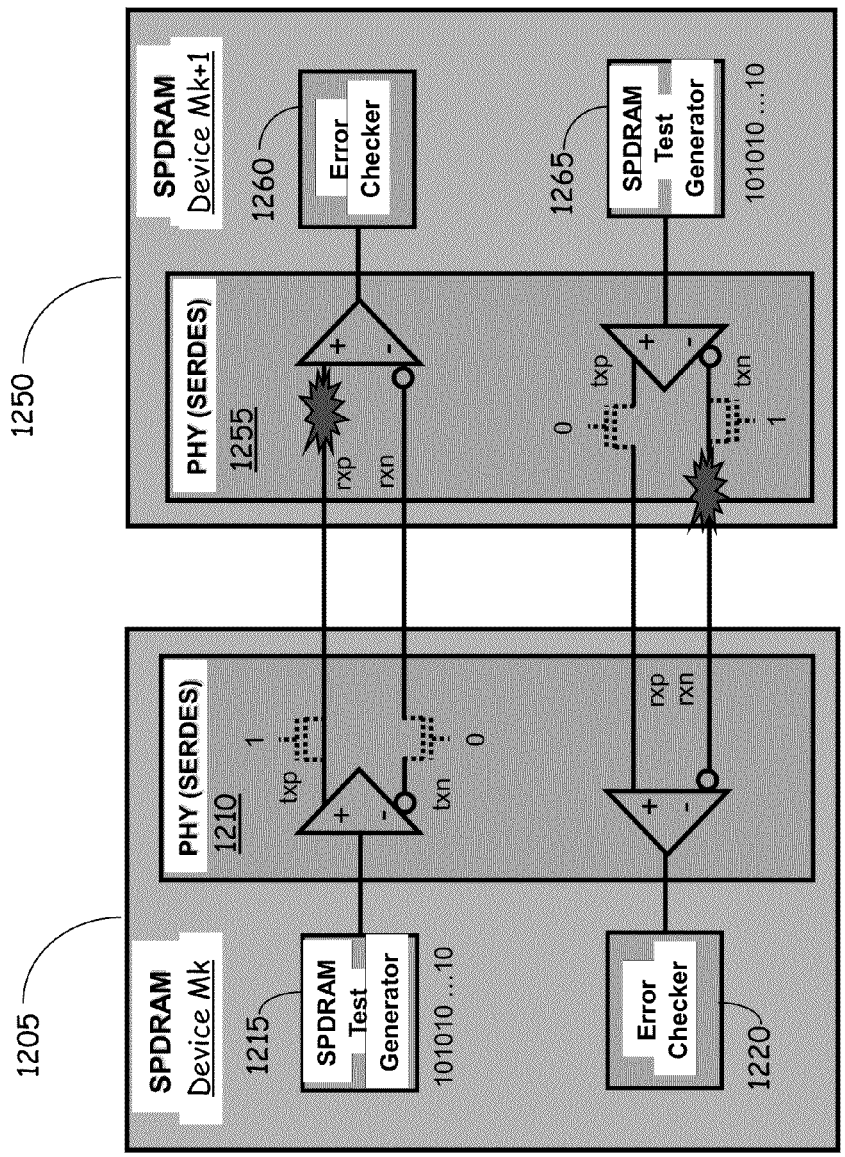
FIG. 12 is an illustration of an embodiment of open faults detection on differential bonding wires.

FIG. 12 is an illustration of an embodiment of open faults detection on differential bonding wires. In FIG. 12, an SPDRAM device Mk 1205, including an SPDRAM test generator 1215, error checker 1220, and SERDES 1210, is coupled with an SPDRAM device Mk+1 1250, including an SPDRAM test generator 1265, error checker 1260, and SERDES 1255. In an example, the broken bonding wires as shown in FIG. 12 leave the bonding wires open. For detection of such defects, the test path may be set up by enabling the control function ser[m,0]=1 and ser[h,1]=1 and leaving other control inputs to logical 0. Under this test configuration, if a transmitter of device Mk 1205 or device Mk+1 1250 sends a 1010..1010 test pattern through the respective serializer to all connecting deserializers, the test pattern cannot be recovered at the receiving device if the bonding wire is broken. Thus, the broken bonding wire defect may be detected and located by checking a success of data recovery at each deserializer. In some embodiments, stuck-at faults that model the differential bonding wires to the supply power or ground and bridging faults that model shorts of the differential bonding wires to any other bonding wires may be detected similarly by establishing the test paths via the control functions. For stuck-at faults, for example, the constant logic value is presented in the test path and no test pattern is recovered. For detection of bridging faults, if different test patterns are applied to each pair of interacting transmitter and receiver, the bridging faults prevent the test pattern from recovery at the RX and they are detected. In some embodiments test methods may include test methods provided in U.S. patent application Ser. No. 12/359,025, entitled "Fault Testing for Interconnections", filed Jan. 23, 2009.

Figure 13:
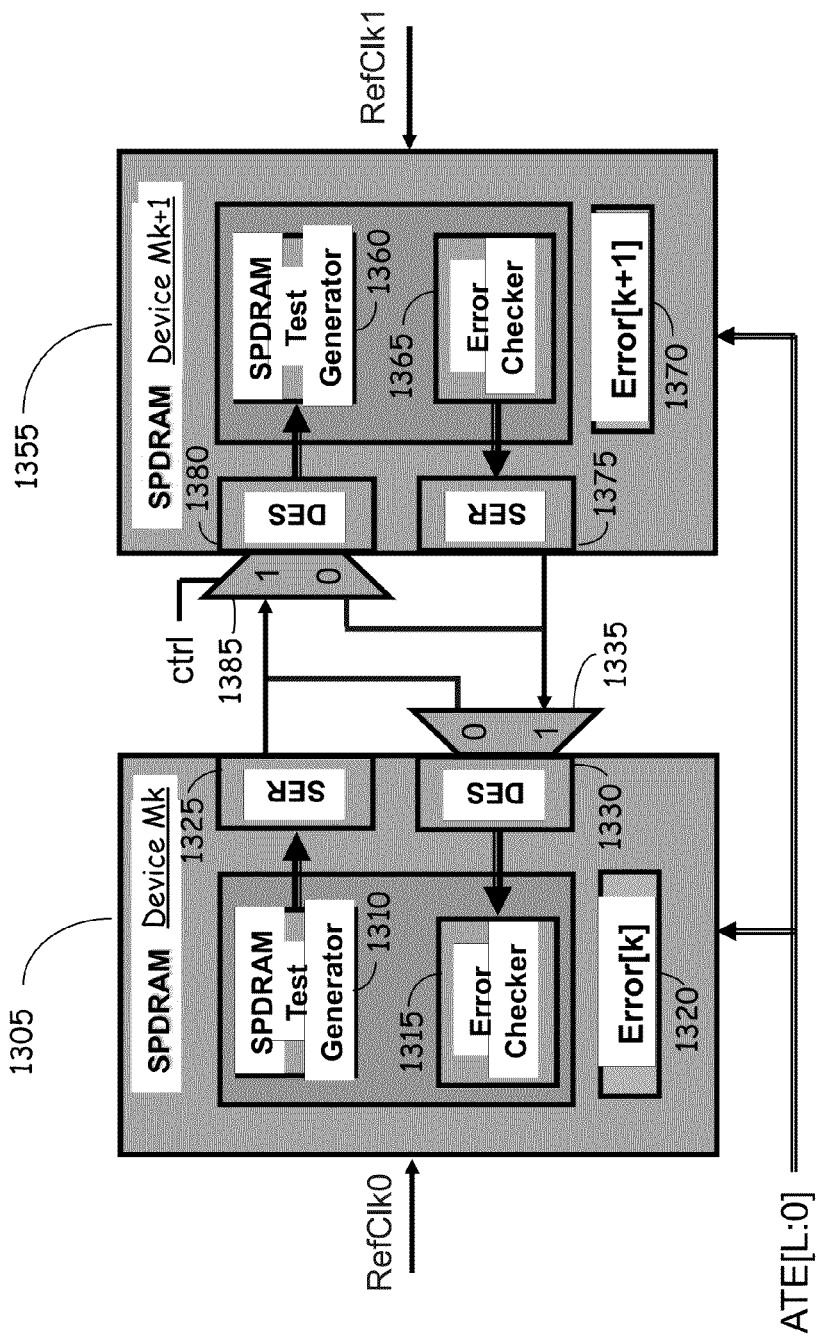
FIG. 13 is an illustration of an embodiment of a multi-site test environment to test devices and clock skew tolerance between test devices.

FIG. 13 is an illustration of an embodiment of a multi-site test environment to test devices and clock skew tolerance between test devices. In FIG. 13, an SPDRAM device Mk 1305, including an SPDRAM test generator 1310, error checker 1315, serializer (SER) 1325, and deserializer (DES) 1330, is coupled with an SPDRAM device Mk+1 1350, including an SPDRAM test generator 1360, error checker 1365, SER 1375, and DES 1380. DES 1330 is coupled with a multiplexor 1335 or other switching element and DES 1380 is coupled with a multiplexor 1385 or other switching element to control a signal path between device Mk 1305 and device Mk+1 1350. However, the controls for the signal paths between the devices may vary in different embodiments.

For any even number of devices, such as 2N devices, to be tested in parallel, the N pairs of devices under test may be connected as shown in FIG. 13. In the illustrated connection, a self-loop back path may be established for each device and used to test the device itself including memories of the device. An interconnecting path between devices may be utilized to validate the skew tolerance of the devices by varying the clock skew between the clocks of the devices, illustrated as RefClk0 for device Mk 1305 and RefClk1 for device Mk+1, where M=2 for a pair of devices that are connected for the test. In some embodiments, a serial IO test is separated from a memory test. To illustrate an embodiment of a system and method for testing devices, a serial IO test may be performed separately prior to a memory test or may be performed concurrently with the memory test without each test disturbing the other test. The error information of self-loop back and inter-clock skew tests of device Mk may denoted as $E_S[Mk]$ and $E_I[Mk]$, respectively. In some embodiments, differential bonding wire defects may targeted during both a self-loop back test and an interconnecting path test. In some embodiments, the resulting error information may be registered in an Error[Mk] register for device Mk 1305 and an Error[Mk+1] register for device Mk+1 1350.

Figure 14:
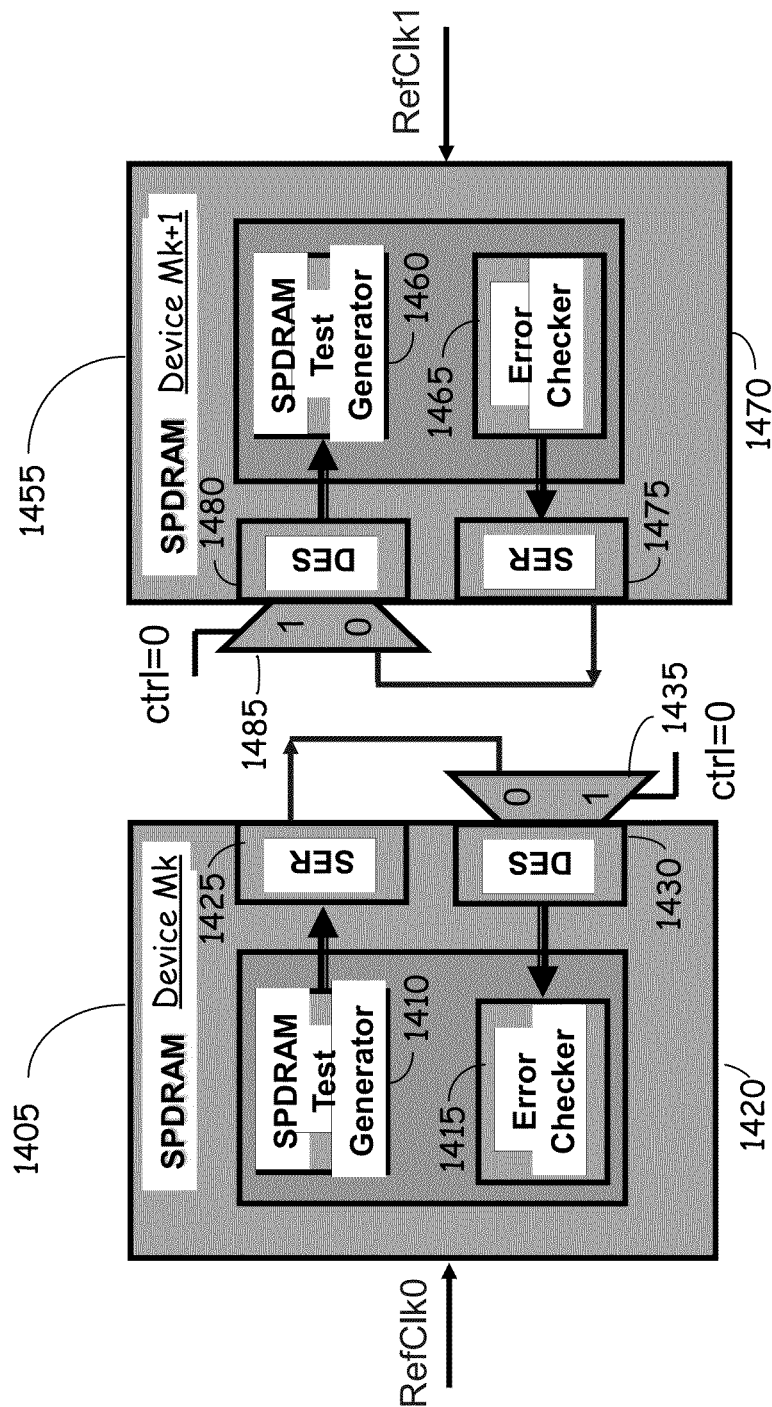
FIG. 14 illustrates embodiments of self-loop back test modes for devices.

FIG. 14 illustrates embodiments of self-loop back test modes for devices. In FIG. 14, an SPDRAM device Mk 1405, including an SPDRAM test generator 1410, error checker 1415, SER 1425, and DES 1430, is coupled with an SPDRAM device Mk+1 1455, including an SPDRAM test generator 1460, error checker 1465, SER 1475, and DES 1480. DES 1430 is coupled with a multiplexor 1435 or other switching element to form a loop back path for device Mk 1405 and DES 1480 is coupled with a multiplexor 1485 or other switching element to form a loop back path for device Mk+1 1450. Thus, the serializer in each PHY is connected to the deserializer in the same PHY.

Figure 15:
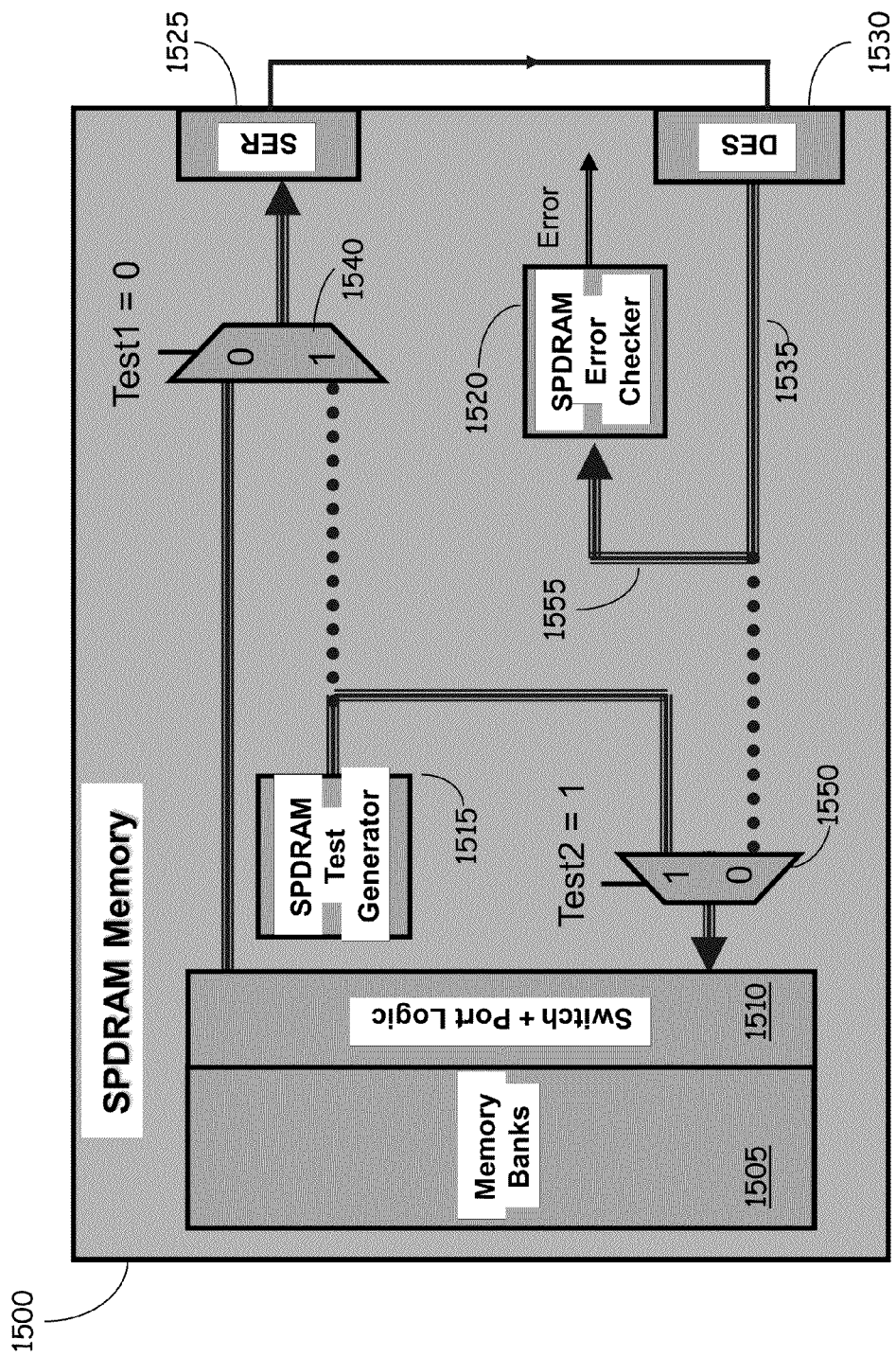
FIG. 15 illustrates an embodiment of a self-loop back mode in a SPDRAM memory.

FIG. 15 illustrates an embodiment of a self-loop back mode in a SPDRAM memory. In this illustration, memory 1500 (such as device Mk 1405 or device Mk+1 1455 of FIG. 14) includes memory banks 1505 and switch and port logic 1510 coupled with a first multiplexor 1540 or other switching element controlled by signal Test1 (with value '0' in this illustration) to direct a signal to SER 1525, which loops back to DES 1530. DES 1530 is coupled to line 1535 and path 1555 to provide a signal to SPDRAM error checker 1520, which may provide an error signal. Further, a SPDRAM test generator 1515 is coupled with a second multiplexor 1550 or other switching element controlled by signal Test1 (with value '1' in this illustration) to provide generated test signals to switch and port logic 1510. In the self-loop back test mode, as illustrated in FIG. 15, the test patterns generated to test memories including the memory interface may be generated from the SPDRAM test generator 1515. The generated test commands are supplied to the memory device interface (being directed to switch and port logic 1510 and memory banks 1505) and the test responses are delivered to the error checker via the serial IO self-loop back path (from SER 1525 to DES 1530).

Differential bonding wire defects may also be targeted at the same time by providing the path control illustrated in FIG. 11. In some embodiments, a serial IO test is performed without involving the memory. Such a serial IO test path may be established by providing Test1=1 in FIG. 15. During the serial IO test mode, the generated test patterns are directly applied to the serializer 1525 and are received at the connected deserializer 1530 via the self-loop back path for the error check.

Figure 16:
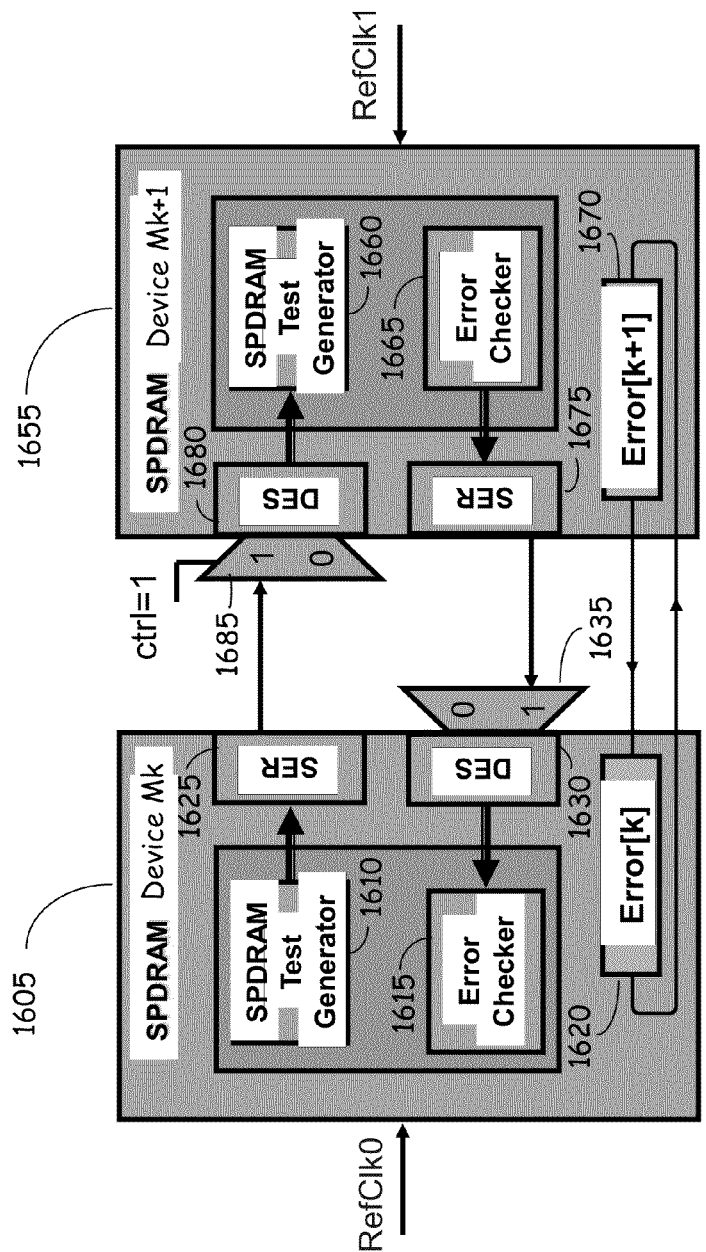
FIG. 16 is an illustration of an embodiment of an inter-device test path.

FIG. 16 is an illustration of an embodiment of an inter-device test path. In this illustration, an embodiment of a multi-site test configuration includes two interconnected devices interacting during the test. In FIG. 16, an SPDRAM device Mk 1605, including an SPDRAM test generator 1610, error checker 1615, SER 1625, DES 1630, and error register 1620 (Error[Mk]) is coupled with an SPDRAM device Mk+1 1655, including an SPDRAM test generator 1660, error checker 1665, SER 1675, DES 1680, and error register 1670 (Error[Mk]). DES 1630 is coupled with a multiplexor 1635 or other switching element to form a path from device Mk+1 1655 and DES 1680 is coupled with a multiplexor 1685 or other switching element to form a path from device Mk 1605.

In this illustration, the serializer of each device is connected to the deserializer of another device. The generated test patterns are transmitted from the serializer of one device and recovered at the deserializer of the other device. The recovered test patterns then are checked for errors. However, an issue regarding this test configuration is that an error is not localized, i.e., an error related to a transmitter of a device is detected at the error checker on the other device and would not be reflected in the error being reported by the error detector on the same device. Thus, after a test, error information is communicated between the devices (between Error[Mk] 1620 to Error[Mk+1] 1670) in order to provide error localization. The SPDRAM command generator (1610 or 1660) receives the error information from the error checker and transmits the information to other connecting device. Upon arrival of error information, the error checker (1615 or 1665) updates the error information based on the received error information. In some embodiments, the error registers (1620 and 1670) are exchanged between two interacting devices. Each error checker updates the final error based on the content of exchanged error registers. The exemplary multi-site test may be summarized as:

1. ctrl=0; // self-loop back test configuration //
2. Test each device independently including memories;
3. Obtain $E_S[Mk]$;
4. ctrl=1; // Inter-clock skew test configuration //
5. Test for inter-clock skew tolerance test;
6. Obtain $E_I[Mk]$;
7. Exchange error information of self-loop back test and/or inter-clock skew tolerance test; and
8. Update error information based on exchanged error information.

Table 1 provided below summarizes test decisions based on the error information obtained from the self-loop back test and the inter-clock skew test. The Error indicators $E_S[Mk]$, $E_I[Mk]$ and $E'_I[Mk+1]$ contain the test results obtained from the test paths that involve the transmitter (TX[Mk]) and the receiver (RX[Mk]) of a device Mk. In this table, the $E_S[Mk]$ contains error information of a self-loop back test. The error information of inter-clock skew test is distributed in two interacting devices Mk and Mk+1. The error information of inter-clock skew test regarding the RX[Mk], denoted as $E_I[Mk]$, is obtained from the error checker in device Mk. The error information regarding the TX[Mk] is denoted as $E'_I[Mk+1]$, however, is available at the device Mk+1 and is obtained through exchange of data, such as data provided after test completion. In some embodiments, the test result of self-loop back test of device Mk+1 denoted as $E'_S[Mk+1]$, which is not included in Table 1, is incorporated to refine the test decision of device Mk. In some embodiments, the inter-clock skew may be set to zero during the error information exchange. The term $E'_I[Mk+1]$ denotes the copied or exchanged version of $E_I[Mk+1]$ residing in the device Mk+1. If no error is detected during the test, then $E_S[Mk]=0$, $E_I[Mk]=0$ and $E'_I[Mk+1]=0$ and the device passes the test. However, if $E_S[Mk]=1$, $E_I[Mk]=1$ and $E'_I[Mk+1]=1$ and the device fails the test. In some embodiments, the device is determined to be faulty if $E_S[Mk]=1$ and all others failures accompanied by no self-loop back test failure are considered as marginal. In some embodiments, the binned devices with marginal failures are retested later with the passing devices. The devices falling out from the retest may be screened out further using the smaller clock-skew threshold. In some embodiments, $E'_S[Mk+1]$ is incorporated to indicate invalidity of inter-clock skew test. This is done because a device that fails the self-loop back test may not be reliable for the inter-clock skew test. If a marginally failed device Mk (i.e., $E_S[Mk]=0$) contains the $E'_S[Mk+1]=1$, it is binned separately and retested.

In some embodiments, individual failure cases provided in Table 1 may be used to increase diagnostic resolution. For example, the devices under test may fail during an inter-clock skew test. In this illustration, if $E_S[Mk]=0$ and $E_I[Mk]=1$, it may be inferred that the failure is related to the clock skew between RX[Mk] and TX[Mk+1] or/and the health of TX[Mk+1]. After the counterpart data is examined, the skew may be varied to find the threshold skew that the failed device can tolerate. If the devices fail only in the self-loop back test, i.e. $E_S[Mk]=1$ and $E_I[Mk]=E'_I[Mk+1]=0$, some defects may have caused the failure of the TX[Mk] and the RX[Mk] to communicate. For example, some defects may increase an intra-pair skew between differential signals in TX[Mk] but decrease the intra-pair skew tolerance in RX[Mk]. Thus, when TX[Mk] and the RX[Mk] are connected during the self-loop back test, the test patterns may not be properly recovered at the RX[Mk] and thus the patterns fail the test. The TX[Mk] and the RX[Mk] may, however, pass the inter-clock skew test because the connecting TX[Mk+1] or RX[Mk+1] may aid to overcome the intra-pair skew during the test. In some embodiments, the failed device including both the TX and the RX may be characterized for diagnosis. The self-loop back test failure combined with any other inter-clock skew failure may be inferred to a more definite failure. The last three cases in Table 1 address failed components. In some embodiments, the devices that fail only in the inter-clock test may be considered as marginally passed. The marginally passed devices may be binned separately from the passed devices and applied to applications where the reduced inter-clock skew tolerance is acceptable.

TABLE 1

| $E_S$[Mk] | $E_I$[Mk] | $E'_I$[Mk + 1] | Test Decision |
|---|---|---|---|
| 0 | 0 | 0 | Pass |
| 0 | 0 | 1 | Inter-clock skew test failure related to TX[Mk] |
| 0 | 1 | 0 | Inter-clock skew test failure related to RX[Mk] |
| 0 | 1 | 1 | Inter-clock skew test failure |
| 1 | 0 | 0 | Self-loop back test failure |
| 1 | 0 | 1 | TX[Mk] failure |
| 1 | 1 | 0 | RX[Mk] failure |
| 1 | 1 | 1 | Fail |

In some embodiments, a system provides for systematic location of defective parts. For the purposes of this discussion, the multi-site test environment presented in FIG. 13 may be assumed, but embodiments are not limited to this implementation. In some embodiments, a multi-site test may be executed via varying test paths and the results for each path may be collected. For example, a test path may be expressed using the state of signal "ctrl" because the designated test path can be obtained by forcing ctrl to the designated state. The multi-site test via self-loop back test path, for example, may be represented by ctrl=0 and the inter-clock skew test path by ctrl=1.

Tables 2 and 3 below summarize a list of TX and RX values that constitute failed test paths. In Tables 2 and 3, the TX[Mk] and RX[Mk] are denoted as $T_{Mk}$ and $R_{Mk}$. The list of transmitters and receivers included in the failed test paths are indicated by $E_S$[Mk], and $E_I$[Mk] is denoted as FAIL (Mk, $E_S$[Mk], $E_I$[Mk]). For example, FAIL (Mk, $E_S$[Mk], $E_I$[Mk]) indicating passing in the self-loop back test but failing in the inter-clock skew test may be denoted as FAIL (Mk, 0, 1). For the device under test D, FAIL (D, $E_S$[D], $E_I$[D]) is defined as

FAIL(D,0,0)={ };

FAIL(D,1,0)={{$T_D,R_D$}×{S}}∪FAIL(D,0,0)={($T_D$,S), ($R_D$,S)};

FAIL(D,0,1)={{$T_D,R_D$}×{I}}∪FAIL(D,0,0)={($T_D$,I), ($R_D$,I)};

FAIL(D,1,1)=FAIL(D,0,1)∪FAIL(D,1,0)∪FAIL(D,0,0)={($T_D$,S), ($R_D$,S),($T_D$,I),($R_D$,I)}={($T_D$,*), ($R_D$,*)};

where {$T_D$, $R_D$}×{S,I} is a set of Cartesian products and where S and I denote a self-loop back test and an interconnection test respectively. {($T_D$, S), ($T_D$, I)} and {($R_D$, S), ($R_D$, I)} may be abbreviated to {($T_D$, *)} and {($R_D$, *)}, respectively. For example, the error resulting from the self-loop back test path in device Mk may be expressed as {($T_{Mk}$, S), ($R_{Mk}$,S)}. In some embodiments, exchange of the error information regarding inter-clock skew testing is not necessary for diagnosis because all error information of interacting devices may be made separately be made available for analysis. The FAIL (Mk, $E_S$[Mk], $E_I$[Mk]) resulting from the self-loop back test is provided in second row of the tables, where $E_S$[Mk], $E_I$[Mk]=1,0. Similarly, the FAIL (Mk, $E_S$[Mk], $E_I$[Mk]) resulting from the inter-clock skew test is provided in the third row of the tables where $E_S$[Mk], $E_I$[Mk]=0,1.

FAIL (Mk, $E_S$[Mk], $E_I$[Mk]) resulting from both the self-loop back test and the inter-clock skew test may be obtained by a set union operation of all other cases. That is, FAIL(Mk, 1,1)={ }∪{($T_{Mk+1}$, I), ($R_{Mk}$, I)}∪{($T_{Mk}$, S), ($R_{Mk}$, S)}={($T_{Mk}$,S), ($R_{Mk}$,*), ($T_{Mk+1}$,I)}, where ($R_{Mk}$,*) denote ($R_{Mk}$, I), and ($R_{Mk}$, S). A component that fails in every test path such as $R_{Mk}$ being indicated by ($R_{Mk}$, *) is likely defective. The same analysis may be carried out for the device Mk+1.

TABLE 2

| $E_S$[Mk] | $E_I$[Mk] | FAIL (Mk, $E_S$[Mk], $E_I$[Mk]) |
|---|---|---|
| 0 | 0 | { } |
| 0 | 1 | {($R_{Mk}$, I), ($T_{Mk+1}$, I)} |
| 1 | 0 | {($T_{Mk}$, S), ($R_{Mk}$, S)} |
| 1 | 1 | {($T_{Mk}$, S), ($R_{Mk}$, S), ($R_{Mk}$, I), ($T_{Mk+1}$, I)} = {($T_{Mk}$, S), ($R_{Mk}$, *), ($T_{Mk+1}$, I)} |

TABLE 3

| $E_S$[Mk+1] | $E_I$[Mk+1] | FAIL (Mk+1, $E_S$[Mk+1], $E_I$[Mk+1]) |
|---|---|---|
| 0 | 0 | { } |
| 0 | 1 | {($T_{Mk}$, I), ($R_{Mk+1}$, I)} |
| 1 | 0 | {($T_{Mk+1}$, S), ($R_{Mk+1}$, S)} |
| 1 | 1 | {($T_{Mk+1}$, S), ($R_{Mk+1}$, S), ($T_{Mk}$, I), ($R_{Mk+1}$, I)} = {($T_{Mk+1}$, S), ($R_{Mk+1}$, *), ($T_{Mk}$, I)} |

In some embodiments, the collected failure information for devices Mk and Mk+1 in FIG. 13 may also used to locate defective parts as follows.

FAIL(Mk,$E_S$[Mk],$E_I$[Mk])∪FAIL(Mk+1,$E_S$[Mk+1],$E_I$[Mk+1])

If, for example, the multi-site test resulted in FAIL (Mk, 0,1) and FAIL (Mk+1, 1,0), then FAIL (Mk, 0,1)∪FAIL (Mk+1,1,0)={($T_{Mk+1}$, *), ($R_{Mk}$, I), ($R_{Mk+1}$, S)}. The result of the set operation indicates that the TX[Mk+1] may be defective. With calculated failure information, the receiver may further be analyzed to find the root cause of the failure.

In some embodiments, a procedure for diagnosis of a multi-site test may be summarized as for all pairs of devices Mk and Mk+1:

1. ctrl=0;
3. Run multi-site self-loop back test;
4. Determine $E_S$[Mk] and $E_S$[Mk+1];
5. ctrl=1;
6. Run multi-site inter-clock skew test with defined inter-clock skew;
7. Determine $E_I$[Mk] and $E_I$[Mk+1];
8. Calculate F(Mk, Mk+1)=FAIL (Mk, $E_S$[Mk], $E_I$[Mk+1]) ∪FAIL (Mk, $E_S$[Mk+1], $E_I$[Mk]);
9. if F(Mk, Mk+1)={ }, go to step 14;
10. if ∀($X_j$,*)∈F(Mk, Mk+1), then $X_j$ in device j may be defective where j∈{Mk,Mk+1};
11. F(Mk, Mk+1)=F(Mk, Mk+1)−{($X_j$, *)|($X_j$, *)∈ F(Mk, Mk+1)};
12. if FAIL (j, 0,1)⊂F(Mk, Mk+1), marginal failure in {($T_j$, I), ($R_{j⊕1}$, I)};
13. if FAIL (j, 1,0)⊂F(Mk, Mk+1), self-loop back failure in {($T_j$, S), ($R_j$, S)}; and
14. If needed, change inter-clock skew and return to step 6. (The exclusive-OR logical operation is denoted above as the symbol ⊕.)

Figure 17:
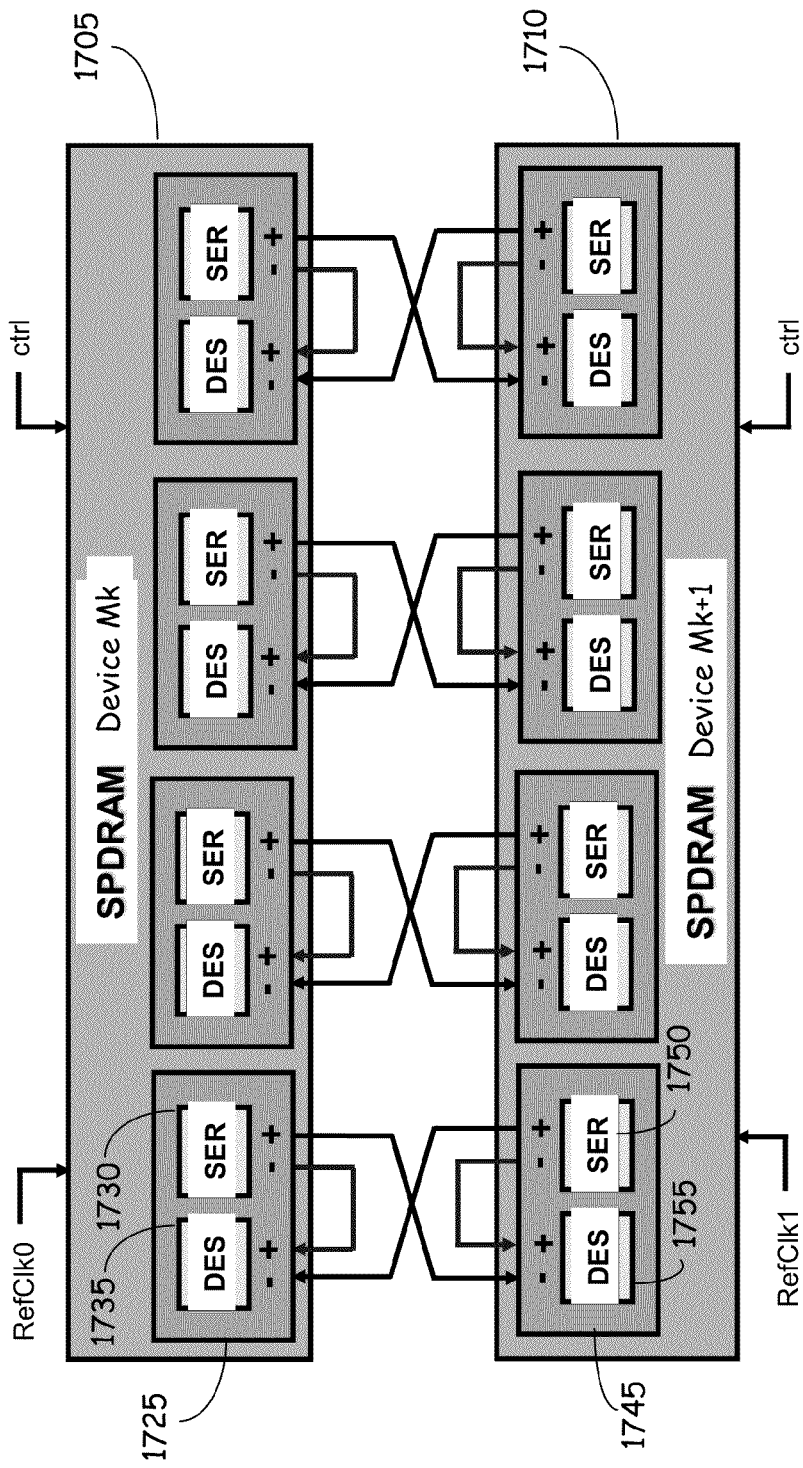
FIG. 17 is an illustration of self-loop back connections in an embodiment of a multi-site test architecture.

FIG. 17 is an illustration of self-loop back connections in an embodiment of a multi-site test architecture. In this illustration, a negative node of each serializer carries an inverted signal to the positive node of the deserializer of the same port. In this illustration, an SPDRAM device Mk 1705 is coupled with an SPDRAM device Mk+1 1710. Each port 1725 of device Mk 1705, with serializer 1730 and deserializer 1735, is arranged such that such that the negative node of serializer 1730 is coupled with the positive node of deserializer 1725 of the same port. Similarly, each port 1745 of device Mk+1

1715, with serializer 1750 and deserializer 1755, is arranged such that such that the negative node of serializer 1750 is coupled with the positive node of deserializer 1755 of the same port. Further, each port 1725 of device Mk 1705 is coupled with a port 1745 of device Mk+1 1710 such that the positive node of serializer 1730 is coupled with the negative node of deserializer 1755 and the positive node of serializer 1750 is coupled with the negative node of deserializer 1735. In some embodiments, different connection assignments are made for the same test.

Figure 18:
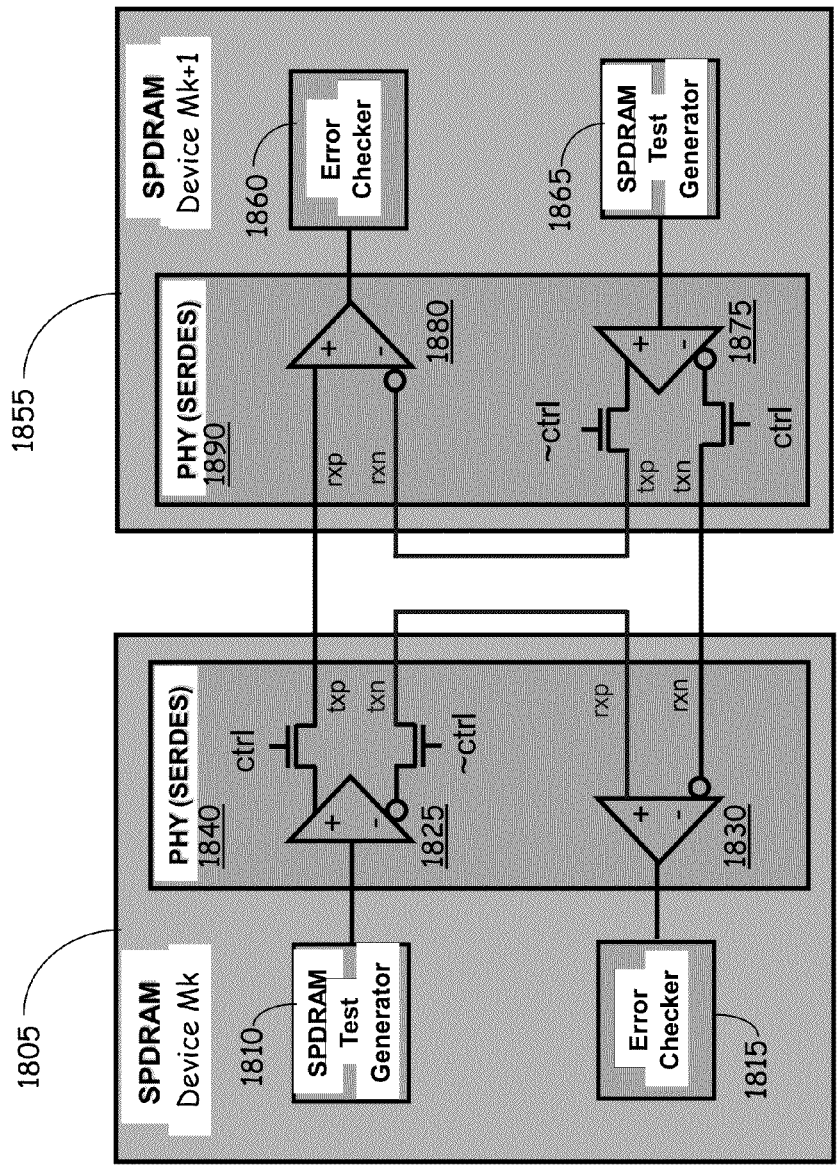
FIG. 18 is an illustration of a multi-site test architecture.

FIG. 18 is an illustration of a multi-site test architecture. In some embodiments, a test architecture may be implemented as provided in FIG. 18 without relays. In FIG. 18, an SPDRAM device Mk 1805, including an SPDRAM test generator 1810, error checker 1815, and PHY 1840 with serializer (SER) 1825, and deserializer (DES) 1830, is coupled with an SPDRAM device Mk+1 1855, including an SPDRAM test generator 1860, error checker 1865, and PHY 1890 with SER 1875, and DES 1880. The positive node of SER 1825 and the negative node of SER 1875 are connected or disconnected by transistors controlled by signal ctrl, while the negative node of SER 1825 and the positive node of SER 1875 are connected or disconnected by transistors controlled by signal ~ctrl. In this illustration, each serializer may be connected to the deserializer in the same device via self-loop back test path and to the deserializer of the other device through the inter-clock skew test path. In some embodiments, the self-loop back test path is established by connecting complementary ports in order to maintain a planar layout trace, where a planar layout trace is a layout trace in which no wires are crossing. In some embodiments, the test architecture include the clock skew tolerance being tested on all pairs of serializer and deserializer on the connecting devices and the differential bonding wire test being naturally embedded in the multi-site test scheme. The same test and diagnostic analysis may be carried out in this test architecture by employing $\{T, R\} \times \{+, -\}$ instead of $\{T, R\} \times \{S, I\}$.

Figure 19:
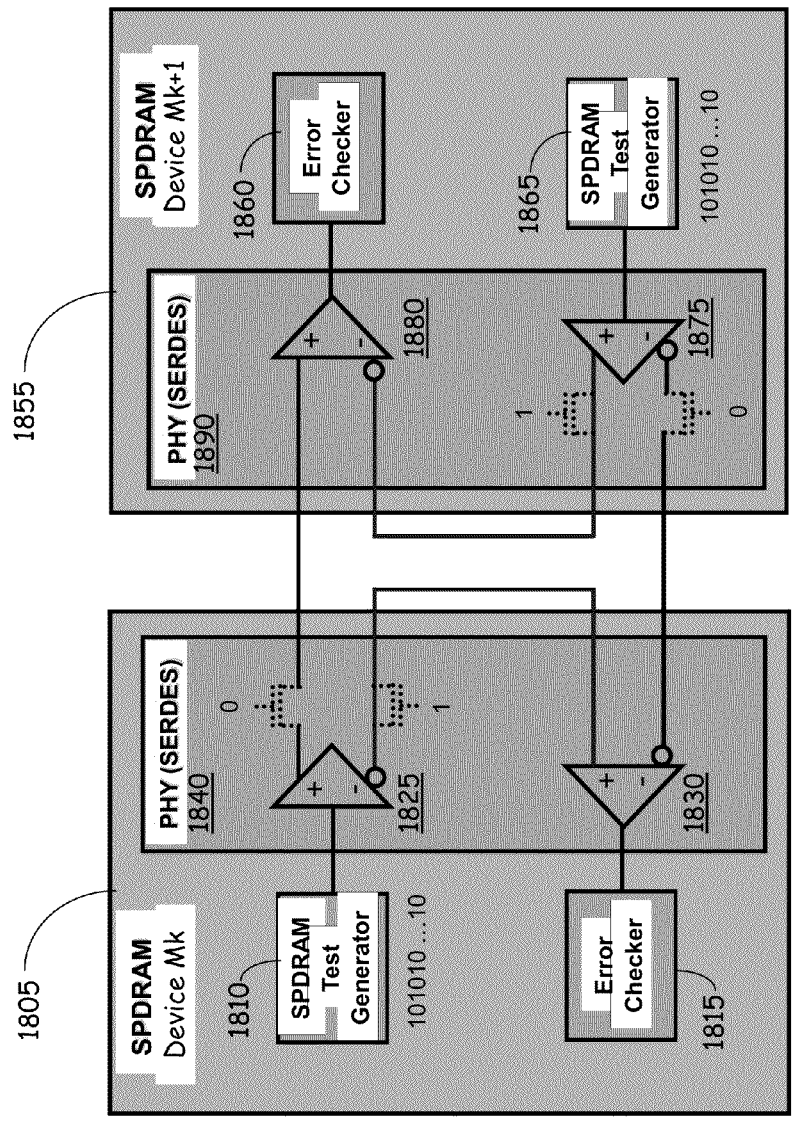
FIG. 19 is an illustration of an embodiment of a multi-site test configuration for a device test via a self-loop back test path.
Figure 20:
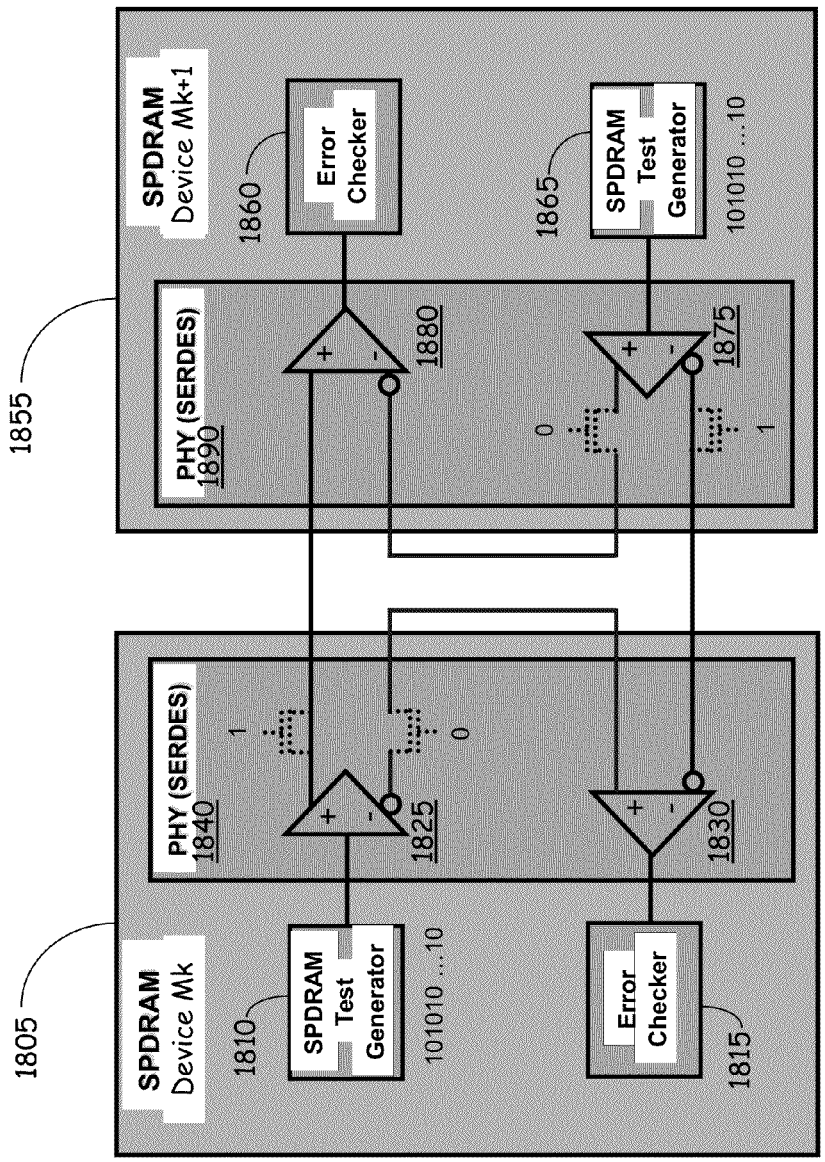
FIG. 20 is an illustration of an embodiment of an inter-device test path.

FIG. 19 is an illustration of an embodiment of a multi-site test configuration for a device test via a self-loop back test path. FIG. 20 is an illustration of an embodiment of a skew tolerance test via inter-clock skew test paths. FIGS. 19 and 20 contained the elements described with regard to FIG. 18. If ctrl=0, as shown in FIG. 19, the self-loop back test paths are established between all pairs of serializer and deserializer on each device using one of two differential wires. Only one pair of serializer and deserializer is depicted in FIG. 19. The same tests may be applied to the device as described with regard to FIGS. 13 through 15. If ctrl=1, the skew tolerance may be tested in this test configuration in the same manner as described with regard to FIG. 16. Similarly, the error information may be exchanged at the end of skew tolerance test.

Figure 21:
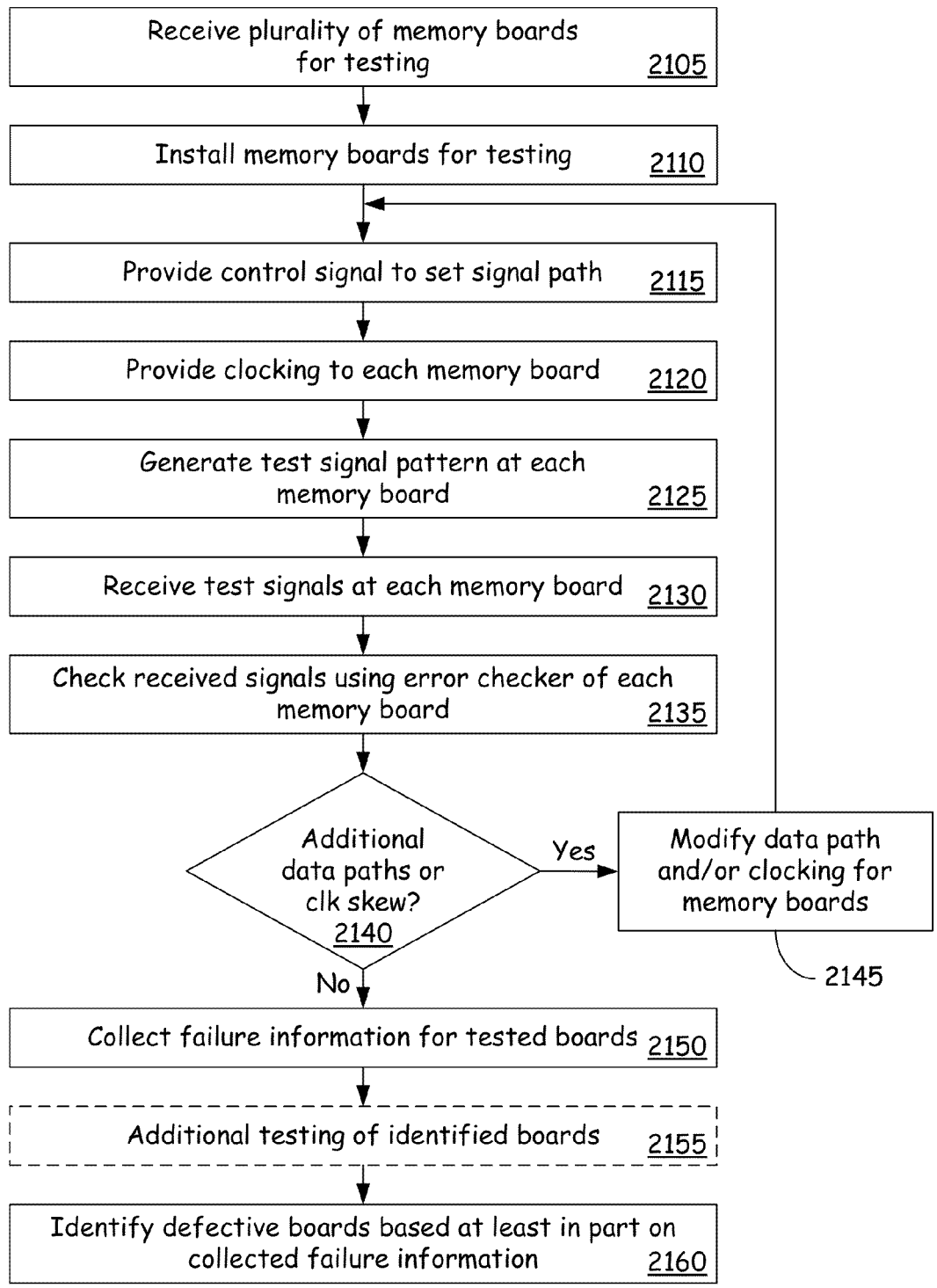
FIG. 21 is a flow chart illustrating an embodiment of a process for multi-site testing of computer memory boards or other memory devices.

FIG. 21 is a flow chart illustrating an embodiment of a process for multi-site testing of computer memory boards or other memory devices. In this illustration, multiple memory boards are received for testing 2105, and a certain number are installed for testing. The memory boards may be SPDRAM memory boards. Depending on the implementation, any number of memory boards may be tested at the same time. In some embodiments, for testing a control signal or signals may be sent to establish a data path for the control signals 2115, such as a control signal to control test relays or switches for each memory board to establish the data paths. Data paths may include paths for inter-device tests and paths for self-loop back tests. Clocking may also be provided to each memory board 2120, which may include the introduction of clock skew between the memory boards. Test pattern signals may be generated at one or more memory boards 2125, and test signals may be received by the memory boards 2130. The received signals are checked using one or more error checkers of each receiving memory board 2135.

If there are more test signal paths or clock skew settings to be tested 2140, the data path, clocking, or both for the memory boards are modified 2145, and the testing is repeated. When the testing is completed, the failure information for the tested memory boards is collected 2150. Additional testing of certain identified boards may be required 2155. Defective boards are then identified based at least in part on the collected failure information for the board tests 2160.

Figure 22:
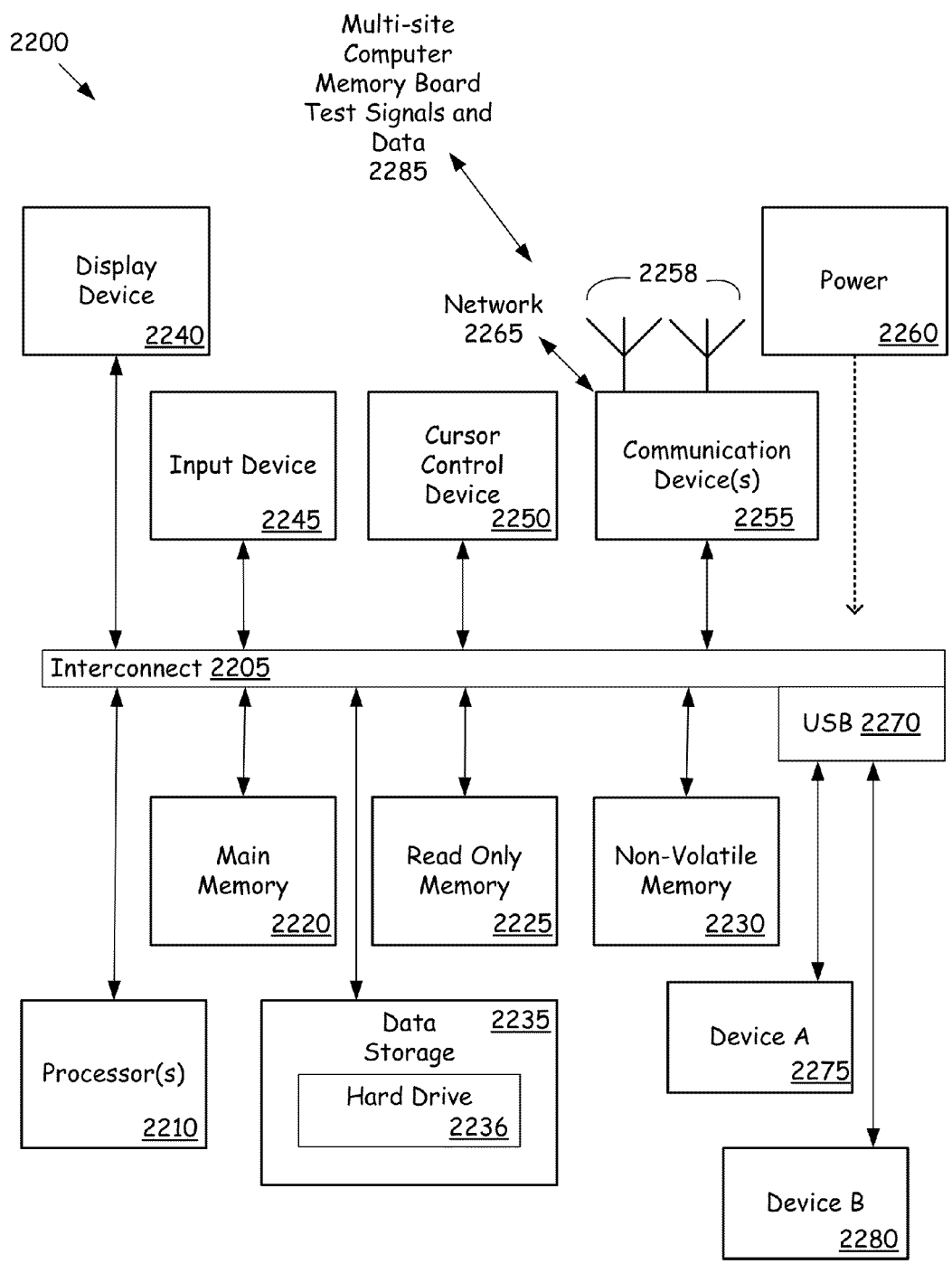
FIG. 22 is an illustration of an embodiment of a computing device that may be utilized in an embodiment.

FIG. 22 is an illustration of an embodiment of a computing device that may be utilized in an embodiment. In this illustration, certain standard and well known components that are not germane to the present description are not shown, and certain illustrated elements may not be contained in an embodiment of a computing device. Under some embodiments, the device 2200 comprises an interconnect or crossbar 2205 or other communication means for communicating information. The device 2200 further includes a processing means such as one or more processors 2210 coupled with the interconnect 2205 for processing information. The processors 2210 may comprise one or more physical processors and one or more logical processors. Further, each of the processors 2210 may include multiple processor cores. The interconnect 2205 is illustrated as a single interconnect for simplicity, but may represent multiple different interconnects or buses and the component connections to such interconnects may vary. In some embodiments, the processors 2210 may be utilized to generate control signals and test signal patterns provided to establish and run multi-site computer memory board testing and to handle and evaluate test result data, such as signals and data provided and data received as illustrated in FIGS. 1-21 above.

The interconnect 2205 shown in FIG. 22 is an abstraction that represents any one or more separate physical buses, point-to-point connections, or both connected by appropriate bridges, adapters, or controllers. The interconnect 2205 may include, for example, a system bus, a PCI or PCIe bus, a HyperTransport or industry standard architecture (ISA) bus, a small computer system interface (SCSI) bus, a IIC (I2C) bus, or an Institute of Electrical and Electronics Engineers (IEEE) standard 1394 bus, sometimes referred to as "Firewire". ("Standard for a High Performance Serial Bus" 1394-1995, IEEE, published Aug. 30, 1996, and supplements) The device 2200 further may include a serial bus, such as USB bus 2270, to which may be attached one or more USB compatible devices, such as device A 2275 and device B 2280.

In some embodiments, the processors 2210 may be utilized to support one or more virtual machines. In some embodiments, the device 2200 further comprises a random access memory (RAM) or other dynamic storage device as a main memory 2220 for storing information and instructions to be executed by the processors 2210. Main memory 2220 also may be used for storing temporary variables or other intermediate information during execution of instructions by the processors 2210. RAM memory includes dynamic random access memory (DRAM), which requires refreshing of memory contents, and static random access memory (SRAM), which does not require refreshing contents, but at increased cost. DRAM memory may include SPDRAM, as well as synchronous dynamic random access memory (SDRAM) and extended data-out dynamic random access memory (EDO DRAM). The device 2200 also may comprise a read only memory (ROM) 2225 or other static storage device for storing static information and instructions for the processors 2210. The device 2200 may include one or more non-volatile memory devices 2230 for the storage of certain elements, including, but not limited to, system BIOS and one or more pre-OS applications.

Data storage 2235 may also be coupled to the interconnect 2205 of the device 2200 for storing information and instructions, including, but not limited to, data regarding memory board testing. The data storage 2235 may include a magnetic disk, an optical disc and its corresponding drive, or other memory device. Such elements may be combined together or may be separate components, and utilize parts of other elements of the device 2200. In a particular embodiment, the data storage 2235 may include a hard drive 2236.

The device 2200 may also be coupled via the interconnect 2205 to a display 1940, such as a cathode ray tube (CRT) display, a liquid crystal display (LCD), a plasma display, or any other display technology, for displaying information to an end user. In some embodiments, the display 2240 may be utilized to display television programming. In some environments, the display 2240 may include a touch screen that is also utilized as at least a part of an input device. In some environments, the display 2240 may be or may include an audio device, such as a speaker for providing audio information, including the audio portion of a television program. An input device 2245 may be coupled to the interconnect 2205 for communicating information and/or command selections to the processors 2210. In various implementations, the input device 2245 may be a keyboard, a keypad, a touch screen and stylus, a voice-activated system, or other input device, or combinations of such devices. Another type of user input device that may be included is a cursor control device 2250, such as a mouse, a trackball, or cursor direction keys for communicating direction information and command selections to the one or more processors 2210 and for controlling cursor movement on the display 2240.

One or more communication elements 2255 may also be coupled to the interconnect 2205. Depending upon the particular implementation, the communication elements 2255 may include a transceiver, a wireless modem, a network interface card, LAN (Local Area Network) on motherboard, or other interface device. The communication elements 2255 may provide a connection to a network 2265 to transmit network data, such as Ethernet data. The uses of a communication device 2255 may include reception of signals from wireless devices. For radio communications, the communication device 2255 may include one or more antennas 2258, including any dipole or monopole antennas, as required. In one embodiment, the communication elements 2255 may include a firewall to protect the device 2200 from improper access.

In some embodiments, data received via the communication devices 2255 may include multi-site computer memory board test signals and data 2285. In some embodiments, the signals and data 2285 include transmitted control signals and test signal patterns provided to establish and run multi-site computer memory board testing and test result data, such as signals and data provided and data received as illustrated in FIGS. 1-21 above.

The device 2200 may also comprise a power device or system 2260, which may comprise a power supply, a battery, a solar cell, a fuel cell, or other system or device for providing or generating power. The power provided by the power device or system 2260 may be distributed as required to elements of the device 2200.

In the description above, for the purposes of explanation, numerous specific details are set forth in order to provide a thorough understanding of the present invention. It will be apparent, however, to one skilled in the art that the present invention may be practiced without some of these specific details. In other instances, well known structures and devices are shown in block diagram form. There may be intermediate structure between illustrated components. The components described or illustrated herein may have additional inputs or outputs which are not illustrated or described.

The present invention may include various processes. The processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Portions of the present invention may be provided as a computer program product, which may include a computer-readable medium having stored thereon computer program instructions to be executed by a processor, which instructions may be used to program a computer (or other electronic devices) to perform a process according to the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of tangible media/computer-readable medium suitable for storing electronic instructions.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment,

What is claimed is:

1. A method of testing computer memory devices comprising:
coupling a plurality of memory devices, each memory device having a serializer output and a deserializer input, wherein the serializer output of a first memory device is coupled with a deserializer input of one or more of the memory devices of the plurality of memory devices;
generating test signal patterns using a test generator of each memory device; and
serializing the test signal pattern at each memory device, and transmitting the serialized test pattern for testing of the plurality of memory devices, wherein testing of the memory devices includes a first test mode and a second test mode, and wherein the first test mode is a serial IO (input-output) test mode and the second test mode is a memory interface test mode;
wherein the serial IO test mode is separated from the memory interface test mode; and
wherein test patterns generated for the memory interface test mode are limited to test patterns that are authorized for the memory interface test mode, and wherein test patterns generated for the serial IO test mode include test patterns that are not authorized for the memory interface test mode.

2. The method of claim 1, wherein
the testing for the serial IO (input-output) test mode and the test for the memory interface test mode are conducted via a same plurality of IO links.

3. The method of claim 1, wherein the testing of the plurality of memory devices includes testing for faults including one or more of open, stuck-at and bridging faults on bonding wires of the memory devices.

4. The method of claim 3, further comprising establishing test paths to carry out the testing of bonding wires of the memory devices.

5. The method of claim 1, wherein the testing of the plurality of memory devices includes the testing of clock skew tolerance between test devices.

6. The method of claim 1, wherein the memory interface testing mode includes establishing a self-loop back test, the self-loop back test including connecting the serializer of a first device to the deserializer of the first device.

7. The method of claim 1, wherein the memory interface testing mode includes establishing a inter-clock skew test, the inter-clock skew test including connecting the serializer of a first device to the deserializer of the first device.

8. The method of claim 1, further comprising:
receiving one or more test signals at each of the memory devices, and comparing the received test signals using an error checker of the computer memory device to determine device failures; and
collecting failure information for the memory devices.

9. The method of claim 8, further comprising communicating the collected failure information between the memory devices after testing.

10. The method of claim 8, further comprising identifying one or more defective memory devices based at least in part on the collected failure information.

11. The method of claim 8, further comprising determining a device is marginally defective if the device functions in one or more of a plurality of test signal paths.

12. The method of claim 1, further comprising establishing a time skew for each of the plurality of memory devices.

13. The method of claim 12, further comprising varying the time skews for the memory devices for a plurality of tests of the memory devices.

14. The method of claim 1, further comprising establishing a plurality of test signal paths and collecting failure information for each test signal path.

15. The method of claim 14, wherein establishing the plurality of test signal paths includes establishing a first test signal path for the serial IO test mode and a second test signal path for the memory interface test mode.

16. The method of claim 14, wherein establishing the plurality of test signal paths includes sending control signals for the computer memory devices.

17. A memory device comprising:
one or more memory banks for storage of data;
an output including a serializer to serialize data;
an input including a deserializer to deserialize data;
a test generator to generate one or more test patterns for testing of the memory;
an error detector to detect errors in received data;
a switch and port logic coupled with the memory bank; and
one or more switching elements to establish one or more test paths for the memory device, the test paths including a first test path for a first test mode and a second test path for a second test mode, wherein the first test path is a test path for a serial IO (input-output) test mode and the second test path is a test path for a memory interface test mode:
wherein the serial IO test mode is separated from the memory interface test mode; and
wherein test patterns generated for the memory interface test mode are limited to test patterns that are authorized for the memory interface test mode, and wherein test patterns generated by the test generator for the serial IO test mode include test patterns that are not authorized for the memory interface test mode.

18. The memory device of claim 17, further comprising an error output to provide error data to a memory testing apparatus.

19. The memory device of claim 18, wherein upon the memory device taking part in a test of the memory device with a second memory device, the memory device is to transfer to the second memory device one or more elements of error data generated or collected by the memory device.

20. The memory device of claim 18, wherein upon the memory device taking part in a test of the memory device with a second memory device, the memory device is to receive from the second memory device one or more elements of error data generated or collected by the second memory device.

21. The memory device of claim 17, wherein the one or more switching elements including one or more switching elements in the output serializer.

22. The memory device of claim 21, wherein the one or more switching elements in the output serializer include a state to loop back signals from the output serializer to the input deserializer.

23. The memory device of claim 17, wherein the one or more switching elements include a switching element to choose either data from the memory or from the test generator to apply to the serializer output.

24. The memory device of claim 17, wherein the one or more switching elements include a switching element to choose either data from the input deserializer or from the test generator to apply to the memory bank.

25. A memory testing apparatus comprising:
an input to receive data from one or more memory devices of a plurality of memory devices, each memory device having a serializer output and a deserializer input, wherein the serializer output of a first memory device is coupled with a deserializer input of one or more of the memory devices of the plurality of memory devices; and
an error checker to check the data from the one or more memory devices for errors, the error checker having a first test mode for testing a first aspect for the plurality of memory devices and a second test mode for testing a second aspect of the plurality of memory devices, wherein the first test mode is a serial IO (input-output) test mode and the second test mode is a memory interface test mode;
wherein the serial IO test mode is separated from the memory interface test mode; and
wherein test patterns generated for the memory interface test mode are limited to test patterns that are authorized for the memory interface test mode, and wherein test patterns generated by a test generator for the serial IO test mode include test patterns that are not authorized for the memory interface test mode.

26. The memory testing apparatus of claim 25, further comprising a decoder to translate data from a first data format to a second data format.

27. The memory testing apparatus of claim 26, wherein the first data format is a format containing a first number of bits and the second data format is a format containing a reduced number of bits.

28. The memory testing apparatus of claim 25, wherein the data received from the one or more memory devices includes failure information for the one or more memory devices, the memory devices receiving one or more test signals and comparing the received signals using an error checker of a computer memory to determine device failures.

29. The memory testing apparatus of claim 25, further comprising one or more switching elements to establish a path for test signals through the memory devices, the switching elements being controlled by control signals.

30. The memory testing apparatus of claim 25, further comprising a test pattern source to produce test pattern signals.

31. A computer-readable non-transitory medium having stored thereon data representing sequences of instructions that, when executed by a processor, cause the processor to perform operations comprising:
coupling a plurality of memory devices, each memory device having a serializer output and a deserializer input, wherein the serializer output of a first memory device is coupled with a deserializer input of one or more of the memory devices of the plurality of memory devices;
generating test signal patterns using a test generator of each memory device; and
serializing the test signal pattern at each memory device, and transmitting the serialized test pattern for testing of the plurality of memory devices, wherein testing of the memory devices includes a first test mode and a second test mode;
wherein the first test mode is a serial IO (input-output) test mode and the second test mode is a memory interface test mode;
wherein the serial IO test mode is separated from the memory interface test mode; and
wherein test patterns generated for the memory interface test mode are limited to test patterns that are authorized for the memory interface test mode, and wherein test patterns generated for the serial IO test mode include test patterns that are not authorized for the memory interface test mode.

32. The medium of claim 31, wherein the testing of the plurality of memory devices includes testing for faults including one or more of open, stuck-at and bridging faults on bonding wires of the memory devices.

33. The medium of claim 32, wherein the instructions further include instructions causing the processor to perform operations comprising:
establishing test paths to carry out the testing of bonding wires of the memory devices.

* * * * *

UNITED STATES PATENT AND TRADEMARK OFFICE
CERTIFICATE OF CORRECTION

PATENT NO. : 8,543,873 B2  
APPLICATION NO. : 12/683365  
DATED : September 24, 2013  
INVENTOR(S) : Chinsong Sul Page 1 of 1

It is certified that error appears in the above-identified patent and that said Letters Patent is hereby corrected as shown below:

In the Claims

Column 19, line 16: after "aspect" delete "for" and replace with "of".

Signed and Sealed this  
Eleventh Day of November, 2014

Michelle K. Lee  
*Deputy Director of the United States Patent and Trademark Office*